United States Patent
Gupta et al.

(10) Patent No.: US 10,536,164 B2
(45) Date of Patent: Jan. 14, 2020

(54) ADAPTING IMAGE VECTORIZATION OPERATIONS USING MACHINE LEARNING

(71) Applicant: Adobe Inc., San Jose, CA (US)

(72) Inventors: Nikhil Gupta, Uttar Pradesh (IN); Kriti Dang, Karnataka (IN); Stakshi Jindal Garg, Uttar Pradesh (IN)

(73) Assignee: Adobe Inc., San Jose, CA (US)

( * ) Notice: Subject to any disclaimer, the term of this patent is extended or adjusted under 35 U.S.C. 154(b) by 196 days.

(21) Appl. No.: 15/815,883

(22) Filed: Nov. 17, 2017

(65) Prior Publication Data

US 2019/0158112 A1    May 23, 2019

(51) Int. Cl.
| | |
|---|---|
| *G06K 9/36* | (2006.01) |
| *H03M 7/30* | (2006.01) |
| *G06T 9/20* | (2006.01) |
| *G06K 9/62* | (2006.01) |
| *G06T 9/00* | (2006.01) |
| *G06K 9/46* | (2006.01) |

(52) U.S. Cl.
CPC ........ *H03M 7/3082* (2013.01); *G06K 9/4604* (2013.01); *G06K 9/6269* (2013.01); *G06T 9/002* (2013.01); *G06T 9/20* (2013.01)

(58) Field of Classification Search
CPC . H03M 7/3082; G06K 9/4604; G06K 9/6269; G06T 9/002; G06T 9/20
USPC ...................................................... 382/232
See application file for complete search history.

(56) References Cited

U.S. PATENT DOCUMENTS

| | | | |
|---|---|---|---|
| 6,606,620 B1* | 8/2003 | Sundaresan | ............ G06F 16/30 |
| 2014/0313216 A1* | 10/2014 | Steingrimsson | ... G06K 9/00402 |
| | | | 345/589 |

(Continued)

OTHER PUBLICATIONS

Wikipedia, "Sobel Operator", https://en.wikipedia.org/w/index.php?title=Sobel_operator&oldid=808336395 Nov. 2, 2017, 6 pages.

(Continued)

*Primary Examiner* — Andrew M Moyer
(74) *Attorney, Agent, or Firm* — Kilpatrick Townsend & Stockton LLP

(57) ABSTRACT

A content-creation computing system transforms an input raster graphic into a output vector graphic by applying a customization specific to visual characteristics of the input raster graphic. The content-creation computing system provides the input raster graphic to a customization-identification network having a multi-label classifier. The content-creation computing system generates, with the multi-label classifier, a first probability that a first customization operation is applicable to the input raster graphic and a second probability that a second customization operation is applicable to the input raster graphic, wherein the first probability is greater than the second probability. The content-creation computing system selects the first customization operation as the customization specific to the input raster graphic. The content-creation computing system executes a vectorization algorithm that performs the first customization operation using the input raster graphic as an input and displays or otherwise outputs a vector graphic generated by the vectorization algorithm.

20 Claims, 11 Drawing Sheets
(5 of 11 Drawing Sheet(s) Filed in Color)

(56) References Cited

U.S. PATENT DOCUMENTS

2016/0267346 A1    9/2016   Jain et al.
2017/0289405 A1   10/2017   Agrawal et al.

OTHER PUBLICATIONS

Wikipedia, "Canny Edge Detector", https://en.wikipedia.org/w/index.php?title=Canny_edge_ detector&oldid=805883077 Oct. 18, 2017, 7 pages.

Szegedy, Christian, et al. "Rethinking the Inception Architecture for Computer Vision", The IEEE Conference on Computer Vision and Pattern Recognition (CVPR), 2016, 9 pages.

Winnemoller, Holger, et al., "XDoG: An eXtended differences-of-Gaussians compendium including advanced image stylization", Computers & Graphic, vol. 36, Issue 6, Oct. 2012, 15 pages.

* cited by examiner

US 10,536,164 B2

ADAPTING IMAGE VECTORIZATION OPERATIONS USING MACHINE LEARNING

TECHNICAL FIELD

This disclosure relates generally to machine-learning systems that transform an image or other graphic to enhance its visual quality by converting the image from a raster graphic to a vector graphic. More specifically, but not by way of limitation, this disclosure relates to adapting image vectorization operations using machine learning.

BACKGROUND

Graphic manipulation applications are often used to convert raster graphics, which depict content in an image using a grid of pixels, to vector graphics, which include data identifying various shapes (e.g., lines, curves, etc.) that are used to depict various content objects in an image. Converting a raster graphic to a vector graphic involves applying a vectorization process, which redraws the content of the raster graphic using a collection of lines, curves, or other shapes.

Existing vectorization solutions apply the same algorithm to all content in a raster graphic when converting from a raster to a vector format. Though this might be useful in cases involving simply images or graphical content, these solutions are inadequate for applications that require a finer level of detail in the vector-based output. For instance, a designer may want to convert raster graphics depicting hand-drawn sketches, hazy images, or oil paintings into vector graphics in order to apply more robust editing techniques available to vector graphics. But applying the same algorithm to all content in a raster graphic could lead to sub-optimal results for certain input images.

For instance, FIG. 1 is a block diagram depicting an example of converting a hazy image depicted in an input raster graphic 102 into an output vector graphic 106 using an existing vectorization process 104. The vectorization process 104 is able to adequately reproduce darker portions of the input raster graphic 102 when generating the output vector graphic 106. But areas of the input raster graphic 102 with fading edges, such as the input regions 108 and 110, are wholly or partially lost in the conversion process, as indicated by the output regions 112 and 114 of the output vector graphic 106. Thus, conventional vectorization solutions are often unsatisfactory for converting certain types of graphic content from a raster format into a vector format.

SUMMARY

Certain embodiments involve adapting image vectorization operations using machine learning. For example, a content-creation computing system transforms an input raster graphic into a output vector graphic by applying a customization specific to visual characteristics of the input raster graphic. The content-creation computing system provides the input raster graphic to a customization-identification network having a multi-label classifier. The content-creation computing system generates, with the multi-label classifier, a first probability that a first customization operation is applicable to the input raster graphic and a second probability that a second customization operation is applicable to the input raster graphic, wherein the first probability is greater than the second probability. The content-creation computing system selects the first customization operation as the customization specific to the input raster graphic. The content-creation computing system executes a vectorization algorithm that performs the first customization operation using the input raster graphic as an input and displays or otherwise outputs a vector graphic generated by the vectorization algorithm.

These illustrative embodiments are mentioned not to limit or define the disclosure, but to provide examples to aid understanding thereof. Additional embodiments are discussed in the Detailed Description, and further description is provided there.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Features, embodiments, and advantages of the present disclosure are better understood when the following Detailed Description is read with reference to the accompanying drawings.

DETAILED DESCRIPTION

Figure 1:
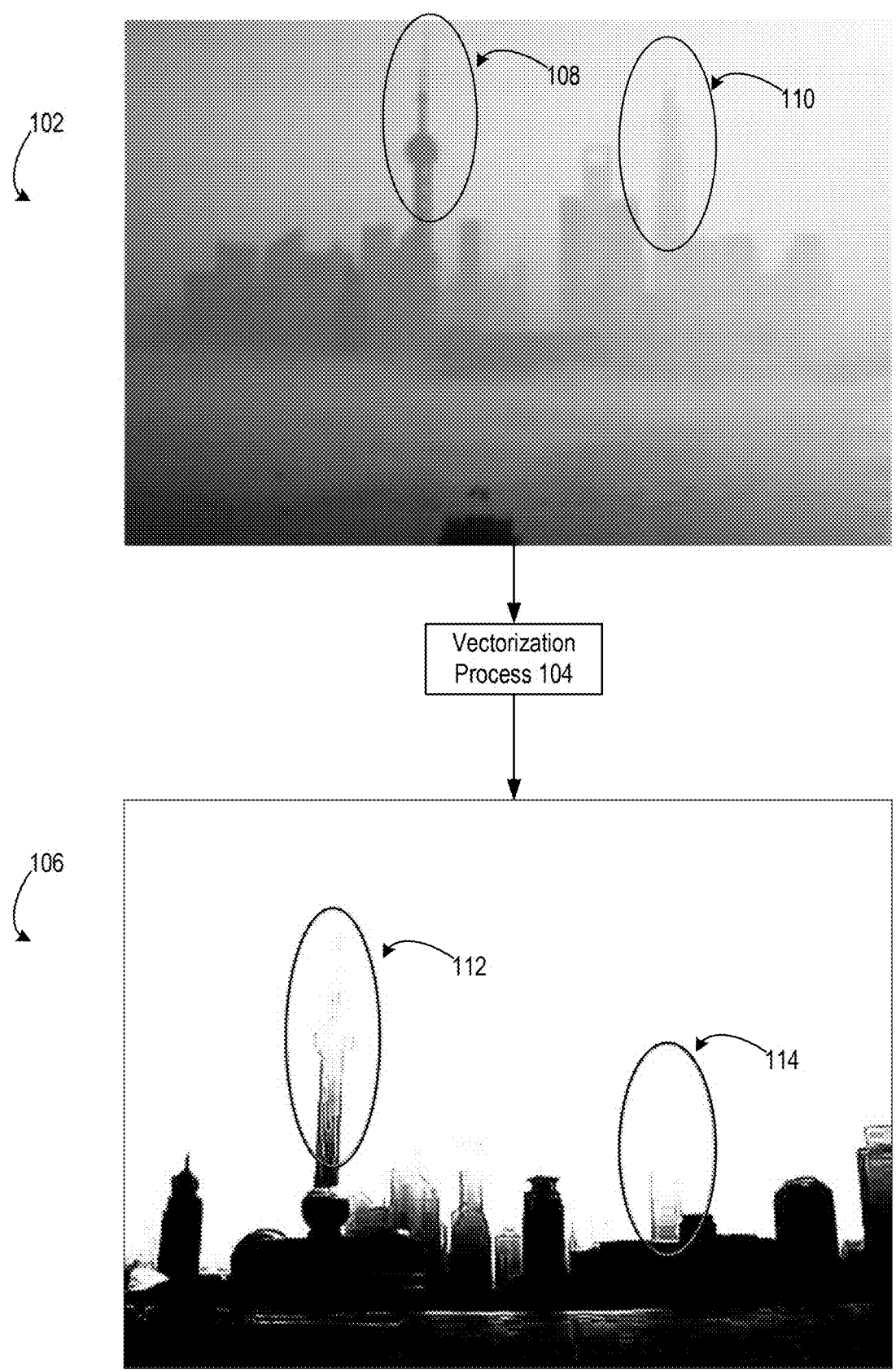
FIG. 1 depicts an example of transforming a raster graphic into a vector graphic.

Certain embodiments involve a vectorization algorithm that performs style transfers on an input raster graphic using different style-exemplar resolutions. For instance, a deep-learning network or other neural network model classifies an input image or other raster graphic into a set of classes. Each class indicates that a likelihood that a certain type of vectorization operations (e.g., cleaning, blending, boosting, etc.) is suitable for vectorising the input raster graphic. A graphic manipulation application automatically selects and applies a set of these vectorization operations to generate a vectorized output graphic. In various embodiments, using a trained neural network to select multiple vectorization operations specific to the characteristics of the input graphic can provide improved raster-to-vector conversions without requiring manual input to modify the vectorization process.

The following non-limiting example is provided to introduce certain embodiments. In this example, a graphic manipulation application, which could be executed on a cloud-based content-creation system, accesses an input raster graphic. Examples of input graphics include electronic images depicting hand-drawn sketches or oil paintings, hazy photographic images with faded or obscured edges, etc. The graphic manipulation application uses the visual characteristics of the input raster graphic to select one or more customized vectorization operations (referred to herein as "customizations") for use in a vectorization algorithm. For instance, the graphic manipulation application provides the input raster graphic to a customization-identification network. The customization-identification network is a convolutional neural network having a multi-label classifier and is trained to compute probabilities of input graphics belonging to different classes (e.g., hand-drawn sketch, oil paintings, etc.). If a probability of a certain class exceeds a threshold, then a particular customization operation is more likely to be applicable to the input raster graphic (i.e., more likely to vectorize the input raster graphic in an aesthetically acceptable manner).

Continuing with this example, the graphic manipulation application selects one or more customizations whose probabilities, as computed by the customization-identification network, indicate that the selected customizations are applicable to the visual characteristics of the input raster graphic. The graphic manipulation application executes a vectorization algorithm that applies the selected customization operations to the input raster graphic. For instance, a particular vectorization operation could include a set of customizations such as a cleaning operation, followed by a blending or boosting operation that use edge detection or augmentation operations (e.g., Canny, Sobel, etc.), and subsequently followed by an extended difference-of-Gaussians ("XDOG") operation. This vectorization pipeline is specific to the visual characteristics of the input raster graphic as recognized by the customization-identification network. The graphic manipulation application outputs a vector graphic generated by the vectorization pipelines.

Certain embodiments described herein can improve content-creation computing systems that transform raster graphics, which include collections of pixels in a bitmap without any concept of separate objects (e.g., lines, shapes, etc.), into vector graphics, which use an image model that identifies collections of lines, curves, shapes, and other discrete objects in an image or other graphic. Existing systems for vectorising raster graphics often apply the vectorization operation to all regions of an input raster graphic, without regard to visual characteristics of different portions of the input raster graphic. This results in the vectorization operation's failure to recognize relevant edges or other objects. By contrast, the specific combination of classification operations applied by the customization-identification network allow more relevant vectorization operations to be automatically selected for a given input image, thereby ensuring that the resulting vectorization pipeline accurately captures relevant semantic content from the input raster graphic. Thus, certain embodiments allow computing devices to produce vectorized versions of input graphics that accurately reproduce certain features specific to certain types of graphics (e.g., oil paintings, hand-drawn sketches, etc.) that previously required manual intervention to recreate a target raster graphic in the vector graphic format (e.g., by re-drawing certain features, re-capturing the original graphic, etc.).

As used herein, the term "input raster graphic" is used to refer to electronic data that depicts semantic content as a collection of pixels in which at least some of the semantic content is not recognizable by a processing device as a specific object (e.g., a line, a shape, an person, etc.).

As used herein, the term "output raster graphic" is used to refer to electronic data generated by a vectorization pipeline that depicts semantic content using a set of paths, where a path or set of paths is recognizable by a processing device as a specific object (e.g., a line, a shape, etc.).

As used herein, the term "vectorization pipeline" is used to refer to program instructions executable by processing hardware that, when executed, include a set of graphics-processing elements (e.g., processes, threads, routines, functions, etc.) arranged so that the output of each element is the input of another element. The processing elements of a vectorization pipeline convert electronics graphic data from an input format (e.g., a raster format) into a vector format.

As used herein, the term "visual characteristics" is used to refer to electronic data that controls how graphics data (e.g., raster graphics, vector graphics, etc.) are displayed on an electronic display device. Example of visual characteristics include semantic content (e.g., object and collections of objects intended to visually depict certain subject matter) and stylistic features (e.g., color schemes, shadow, brush strokes, sharpness of edges, etc.).

Figure 2:
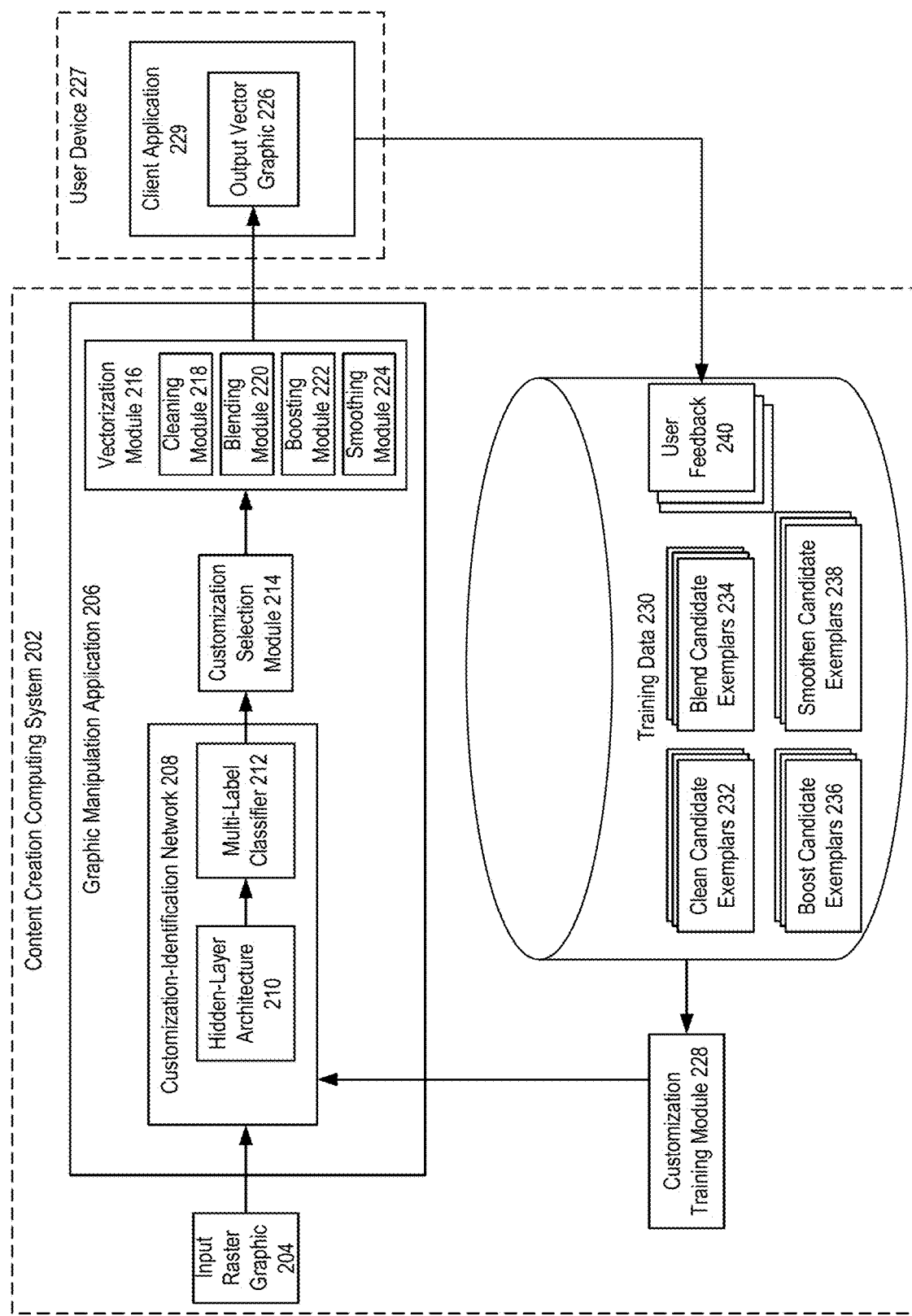
FIG. 2 depicts an example of an operating environment that involves using characteristics of an input raster image or graphic to generate a customized vectorization pipeline, according to certain embodiments of the present disclosure.

Example of an Operating Environment for Generating a Customized Vectorization Pipeline Referring now to the drawings, FIG. 2 depicts an example of an operating environment that involves using characteristics of an input raster image or graphic to generate a customized vectorization pipeline. In this example, a content-creation computing system 202 executes a graphic manipulation application 206 that automatically selects an appropriate vectorization pipeline for a given input raster graphic 204, without requiring user intervention, to improve how an output vector graphic is generated. A given vectorization pipeline includes an ordered set of one or more customization operations (e.g., edge-detection operations) that are selected for certain types of input raster graphics 204 having certain characteristics. For instance, input raster graphics 204 such as hand-drawn sketches, oil-painting, and hazy images could be frequently used cases for graphic manipulation applications 206 such as Adobe Capture CC. As described in detail with respect to the various examples below, the graphic manipulation application 206 uses a customization-identification network 208 to convert various types of raster graphics (e.g., hand-drawn sketches, oil paintings, hazy images, etc.) into output vector graphics 226. An output vector graphic 226 is comprised of various vectors that capture relevant semantic content of the input raster graphic 204. This allows the vectorized graphics to be readily used in illustrations made via any vector-editing software, such as Adobe Illustrator.

In this example, a customization-identification network 208 is used by the graphic manipulation application 206 to select a set of one or more customizations operations for a vectorization pipeline. The customization-identification network 208 is a neural network, such as a deep learning network or other convolutional neural network. The customization-identification network 208 includes a hidden-layer architecture 210 (e.g., a set of hidden layers having respective sets of nodes) and a multi-label classifier 212. An example of a hidden-layer architecture 210 is a modified version of the Inception neural network described in Christian Szegedy et al., "Rethinking the Inception Architecture for Computer Vision," *Proceedings of the IEEE Conference on Computer Vision and Pattern Recognition*, pp. 2818-2826 (2016), which is incorporated by reference herein.

For instance, at least a portion of the Inception version 3 architecture (or another suitable convolutional neural network), can be trained with training data 230 to classify input raster graphics 204 into different types of classes. Labels can be assigned to these classes. But, in contrast to some Inception architecture, a multi-label classifier 212 is used (e.g., rather than a softmax classifier) as the last layer or output layer of the customization-identification network 208. The multi-label classifier 212 is trained to output independent probabilities of various class labels to which the input raster graphic 204 could belong. These probabilities do not need to sum to 1 (or 100%). For instance, the multi-label classifier 212 can be trained to generate probabilities of input raster graphics 204 being oil paintings, hazy images, hand-drawn sketches, respectively.

These probabilities indicate the extent to which a given input raster graphics 204 is a candidate for a cleaning customization operation, a boosting customization operation, a blending customization operation, and a smoothing customization operation, or some other customization operation or set of customization operations used to vectorize a raster graphic. For instance, the graphic manipulation application 206 includes a customization selection module 214 that applies a thresholding filter to the probabilities outputted from the customization-identification network 208. The thresholding filter indicates whether a probability that a given input raster graphic 204 belongs to a certain class exceeds a threshold probability. If a given class probability meets the required threshold probability, the customization selection module 214 selects one or more customization operations that are specific to the given input raster graphic 204 (i.e., that are applicable to an input raster graphic having the selected classes). In some embodiments, the same threshold probability is applied for all classes. In other embodiments, different threshold probabilities are applied for all classes.

The customization selection module 214 causes the graphic manipulation application 206 to select one or more sub-modules of a vectorization module 216, which executes a vectorization algorithm using the input raster graphic 204 as an input. In this example, the sub-modules of the vectorization module 216 include a cleaning module 218 that performs a cleaning customization operation, a blending module 220 that performs a blending customization operation, a boosting module 222 that performs a boosting customization operation, and a smoothing module 224 that performs a smoothing customization operation. But other sets of modules and customization operations may be used. Examples of how the different sub-modules of the vectorization module 216 can be used are described herein with respect to FIGS. 4-5.

In this example, a content-creation computing system 202 uses training data 230 for training a customization-identification network 208 to generate probabilities of input raster graphics 204 being candidates for different types of customization operations. The content-creation computing system 202 includes a customization training module 228. In other embodiments, the training of the 208 is performed by a separate computing system having hardware, such as a processing device that executes the customization training module 228 and a non-transitory computer-readable medium and associated data structures that store the training data 230.

The content-creation computing system 202 executes the customization training module 228 to generate, train, or otherwise develop a customization-identification network 208 based on the training data 230. The customization training module 228 uses clean candidate exemplars 232, blend candidate exemplars 234, boost candidate exemplars 236, smoothen candidate exemplars 238, and user feedback data 240 to do so. A given set of exemplars includes different training raster graphics having visual characteristics that make them more suitable for different types of customization operations. In one example, blend candidate exemplars 234 could be training graphics that are labeled as oil paintings, which could be more likely to require blending operations as part of a vectorization pipeline. In another example, boost candidate exemplars 236 could be training graphics that are labeled as hazy images, which could be more likely to require blending operations as part of a vectorization pipeline.

The customization training module 228 iteratively trains the customization-identification network 208. For instance, the customization training module 228 provides training graphics from the training data 230 to a set of hidden layers in the customization-identification network 208 (i.e., layers of the hidden-layer architecture 210). The customization training module 228 also uses the multi-label classifier 212 to apply training labels to the training graphics. These labels can explicitly identify the training graphics as certain classes (e.g., "oil painting," "sketch," etc.), identify the suitability of certain customization operations (e.g., "clean," "boost," etc.), or both. In some embodiments, the labels can include probabilities generated by the multi-label classifier 212. The customization training module 228 determines if the applied training labels are inaccurate for at least some of the training graphics (e.g., incorrectly classifying a hazy image as a sketch, applying a low-probability "boost" classification to a boost candidate exemplar 236, etc.). If so, the customization training module 228 trains or refines the customization-identification network 208 by adjusting one or more hidden layers in the hidden-layer architecture 210, adjusting the multi-label classifier, or both.

The customization training module 228 outputs the customization-identification network 208 for use by an graphic manipulation application 206 (e.g., by transmitting the customization-identification network 208 to a computing device that executes the graphic manipulation application 206, by storing the customization-identification network 208 in a non-transitory computer-readable medium accessible by the graphic manipulation application 206, etc.). The customization-identification network 208 allows a graphic manipulation application 206 to use the visual characteristics of an input raster graphic 204 to generate an output vector graphic 226.

The content-creation computing system 202 transmits or otherwise provides the output vector graphic 226 to a user device 227 or other computing device that can execute a client application 229. The client application 229 displays the output vector graphic 226. In some embodiments, the client application 229 receives user feedback data 240 in response to presenting the output vector graphic 226. One example of user feedback data 240 is explicit feedback, in which a user input specifically indicates agreement with the results of the vectorization pipeline (e.g., "likes" or "dislikes"). Another example of user feedback data 240 is implicit feedback, in which a user input does not specifically indicate agreement with the results of the vectorization pipeline, but indirectly indicates an acceptance of the vectorization pipeline's result. For instance, implicit feedback could include saving an output vector graphic 226 generated by the vectorization pipeline, using the output vector graphic 226 in another stage of a graphic-editing workflow other than vectorization, etc. The customization training module 228 can train or refine the customization-identification network 208 by adjusting, based on the user feedback data 240, one or more hidden layers in the hidden-layer architecture 210, adjusting the multi-label classifier, or both.

For illustrative purposes, the content-creation computing system 202 is depicted in FIG. 2 as executing the graphic manipulation application 206 and training the customization-identification network 208. But other implementations are possible. In some embodiments, a user device 227 can execute a graphic manipulation application 206 having one or more of the modules depicted in FIG. 2. The content-creation computing system 202 or another training system can train and refine the customization-identification network 208 and provide the customization-identification network 208 to the graphic manipulation application that is executed on the user device 227.

Examples of a user device 227 include, but are not limited to, a personal computer, tablet computer, a desktop computer, a processing unit, any combination of these devices, or any other suitable device having one or more processors. Each user device includes at least one application supported by the content-creation computing system 202. User devices 227 correspond to various users. Examples of the users include, but are not limited to, creative professionals or hobbyists who use creative tools to generate, edit, track, or manage creative content, marketing professionals who use marketing tools to generate, edit, track, or manage online content, or to manage online marking processes, end users, administrators, users who use image tools to create, edit, track, or manage images, advertisers, publishers, developers, content owners, content managers, content creators, content viewers, content consumers, designers, editors, any combination of these users, or any other user who uses digital tools to create, edit, track, or manage digital experiences.

Digital tools, as described herein, include tools such as the graphic manipulation application 206 that are used to perform a function or a workflow electronically. Examples of a digital tool include, but are not limited to, a creation tool, content editing tool, content publishing tool, content tracking tool, content managing tool, content printing tool, content consumption tool, any combination of these tools, or any other tool that can be used for creating, editing, managing, generating, tracking, consuming or performing any other function or workflow related to content. Digital experience, as described herein, includes experience that can be consumed through an electronic device. Examples of the digital experience include content creating, content editing, content tracking, content publishing, content posting, content printing, content managing, content viewing, content consuming, any combination of these experiences, or any other workflow or function that can be performed related to content. Content, as described herein, includes electronic content. Examples of content include, but are not limited to, image, video, website, webpage, user interface, menu item, tool menu, magazine, slideshow, animation, social post, comment, blog, data feed, audio, advertisement, vector graphic, bitmap, document, any combination of one or more content, or any other electronic content.

In some embodiments, a user device 227 is communicatively coupled to the content-creation computing system 202 via one or more data networks. A user of a user device can use various products, applications, or services supported by the content-creation computing system 202 via the data network. Examples of the data network include, but are not limited to, the internet, a local area network, a wireless area network, a wired area network, a wide area network, and the like. In other embodiments, user device 227 can be a content-creation system that hosts one or more of the modules, one or more of the datasets, or both from the example depicted in FIG. 2.

Figure 3:
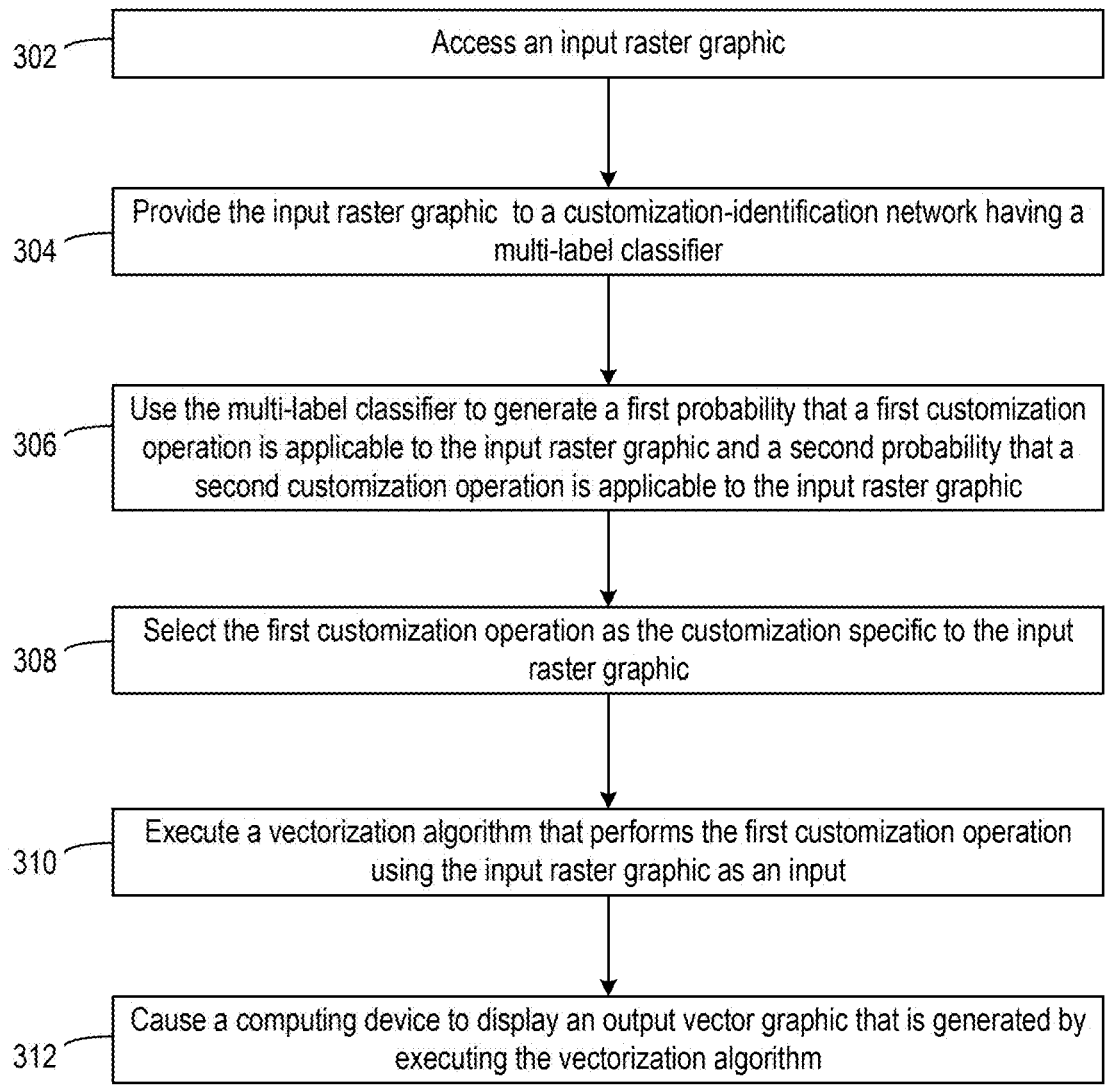
FIG. 3 depicts an example of a process for using a customization-identification network to automatically select and apply one or more custom vectorization operations that transform an input raster graphic into an output vector graphic, according to certain embodiments of the present disclosure.

Examples of Using an Input Raster Graphic's Visual Characteristics to Generate a Customized Vectorization Pipeline FIG. 3 depicts an example of a process 300, which may be performed by the content-creation computing system 202 or another suitable computing system, for using a customization-identification network to automatically select and apply one or more custom vectorization operations that transform an input raster graphic 204 into an output vector graphic. In some embodiments, one or more processing devices implement operations depicted in FIG. 3 by executing suitable program code (e.g., the graphic manipulation application 206). For illustrative purposes, the process 300 is described with reference to certain examples depicted in the figures. Other implementations, however, are possible.

At block 302, the process 300 involves accessing an input raster graphic 204, such as a scan of a drawing, a scan of an oil painting, an image, etc. Accessing the input raster graphic 204 may include, for example, the content-creation computing system 202 retrieving the input raster graphic 204 from a memory device to which a temporary version of the input raster graphic 204 has been stored after the content-creation computing system 202 has received the input raster graphic 204 from a user device 227 via a data network. Additionally or alternatively, accessing the input raster graphic 204 may include a user device 227 retrieving the input raster graphic 204 from a memory device to which a temporary version of the input raster graphic 204 has been stored after the content-creation computing system 202 has retrieved the input raster graphic 204 from an online data source (e.g., a publicly available image or graphic repository).

One or more processing devices execute the graphic manipulation application 206 (or suitable other program code) to implement block 302. Executing the graphic manipulation application 206 causes one or more processing devices to access the input raster graphic 204 that is stored in a non-transitory computer-readable medium. In some embodiments, accessing the input raster graphic 204 involves communicating, via a data bus, suitable signals between a local non-transitory computer-readable medium and the processing device. In additional or alternative embodiments, accessing the input raster graphic 204 involves communicating, via a data network, suitable signals between a computing system that includes the non-transitory computer-readable medium and a computing system that includes the processing device.

The graphic manipulation application 206 transforms the accessed raster graphic into a vector graphic. For instance, at block 304, the process 300 involves providing the input raster graphic 204 to a customization-identification network 208 having a multi-label classifier 212. One or more processing devices execute the graphic manipulation application 206 or other program code to implement block 304. Executing the graphic manipulation application 206 causes the processing device to perform a vectorization algorithm. The vectorization algorithm includes one or more sets of operations that implement the operations modeled by the customization-identification networks 208 described herein.

At block 306, the process 300 involves using the multi-label classifier to generate a first probability that a first customization operation is applicable to the input raster graphic and a second probability that a second customization operation is applicable to the input raster graphic. The first and second probabilities are different from one another. One or more processing devices execute the graphic manipulation application 206 or other program code to implement block 306. For instance, the customization-identification network 208 is trained to generate probabilities of input raster graphics 204 being candidates for various customization operations used by one or more vectorization algorithms. Examples of these customization operations include a cleaning customization operation, a boosting customization operation, a blending customization operation, and a smoothing customization operation, though additional customization operations can also be used. More detailed examples of these customization operations are described herein with respect to FIGS. 4-6.

At block 308, the process 300 involves selecting the first customization operation as the customization specific to the input raster graphic. One or more processing devices execute the graphic manipulation application 206 or other program code to implement block 308. For instance, a customization selection module 214 receives the first and second probabilities outputted from the customization-identification network 208. The customization selection module 214 is executed by a processing device to apply a thresholding operation to the various probabilities outputted from the customization-identification network 208. The customization selection module 214 determines that one or more of these probabilities, including the first probability from block 306, meet or exceed a threshold probability. The customization selection module 214 selects the first probability, which meets or exceeds the threshold probability, for inclusion in a set of customization operations to be performed by the vectorization module 216. The customization selection module 214 also determines that one or more of these probabilities, including the second probability from block 306, do not meet or exceed the threshold probability. The customization selection module 214 excludes the second probability, which does not meet or exceed the threshold probability, from the set of customization operations to be performed by the vectorization module 216.

At block 310, the process 300 involves executing a vectorization algorithm that performs the first customization operation using the input raster graphic as an input. One or more processing devices execute the graphic manipulation application 206 or other program code to implement block 310. For instance, the vectorization module 216, which includes various customization modules, receives the input raster graphic 204 as an input. The vectorization module 216 activates one or more of these customization modules to perform customization operations selected at block 308. A detailed example of a process flow for applying a set of customization operations is described herein with respect to FIG. 4.

At block 312, the process 300 involves causing a computing device (e.g., a user device 227) to display or otherwise provide an output vector graphic 226 that is generated by executing the vectorization algorithm. The graphic manipulation application 206, as executed by one or more suitable processing devices, performs one or more output operations suitable for implementing block 312. In some embodiments, these output operations include causing a display device to render a graphical interface that includes the output vector graphic 226 and causing a display device to display the graphical interface with the output vector graphic 226. Causing a display device to display the graphical interface may involve transmitting suitable commands between the processing device and the display device via a local data bus, transmitting suitable commands between the processing device and the display device via one or more data networks, etc. In additional or alternative embodiments, these output operations include causing a storage device to store the output vector graphic 226 for use by other operations of the graphic manipulation application 206. Causing a storage device to store the output vector graphic 226 may involve transmitting suitable commands between the processing device and the storage device via a local data bus, transmitting suitable commands between the processing device and the storage device via one or more data networks, etc. In additional or alternative embodiments, these output operations transmitting the output vector graphic 226 from a first computing system, such as a content-creation computing system 202 that executes the graphic manipulation application 206, to a second computing system, such as a user device 227, via one or more data networks for display or storage.

Figure 4:
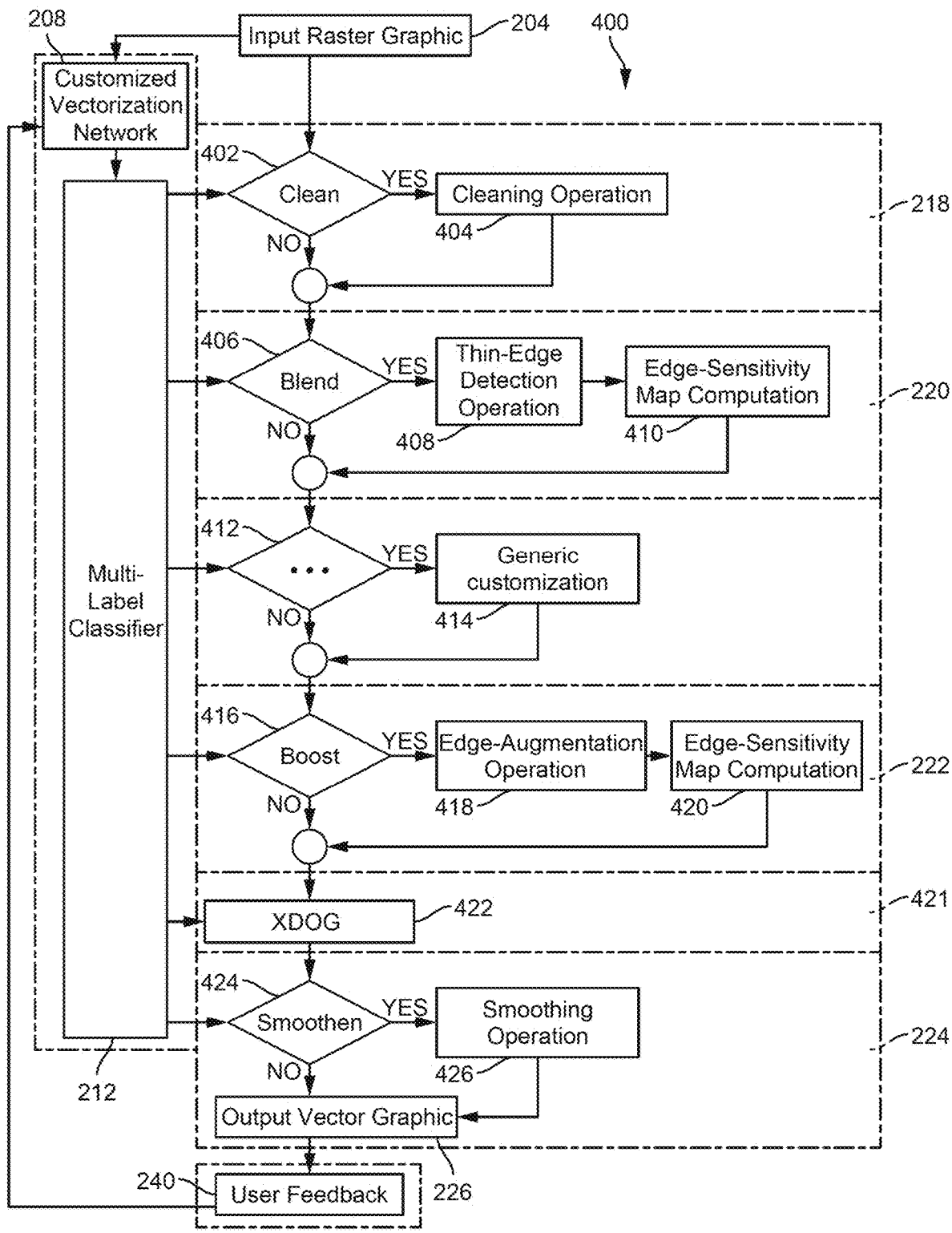
FIG. 4 depicts an example of a vectorization algorithm that uses the process of FIG. 3 to apply various customization operations that transform input raster graphics into output vector graphics, according to certain embodiments of the present disclosure.

FIG. 4 depicts an example of a vectorization algorithm 400 using a customization-identification network 208 to apply various customization operations that transform input raster graphics 204 into output vector graphics 226. For instance, the graphic manipulation application 206 configures the content-creation computing system 202 to retrieve program code having the vectorization algorithm 400 from a non-transitory computer-readable medium and executes the program code with a processing device. The graphic manipulation application 206 provides the input raster graphic 204 to both the customization-identification network 208 and the vectorization algorithm 400. The vectorization algorithm 400 includes various decision blocks for selecting the various customization operations performed by the cleaning module 218, the blending module 220, the boosting module 222, the smoothing module 224, and any other sub-modules of the vectorization module 216. These decision blocks can be included in the various sub-modules of the vectorization module 216, as depicted in FIG. 4, or included in a separate customization selection module 214 that performs a thresholding function, as described above. The vectorization algorithm 400 uses probabilities outputted by the multi-label classifier 212 to determine the outcome of these decision blocks.

For instance, the graphic manipulation application 206 provides input graphic data (i.e., the input raster graphic 204) to a clean decision block 402. The clean decision block 402 determines whether the class label and probability applied to the input raster graphic 204 indicates that a cleaning operation should be performed. For instance, the graphic manipulation application 206 provides a "clean" candidate probability, which is outputted from the multi-label classifier 212, to the clean decision block 402. Cleaning operations may be omitted if, for example, certain input graphics (e.g., images) would be converted into vector representations that are coarser with the cleaning operation as compared to performing vectorization without the cleaning operation. If the "clean" candidate probability meets or exceeds the threshold probability, clean decision block 402 provides the input graphic data to a cleaning operation 404.

In some embodiments, the cleaning operation 404 involves filtering noise from the input raster graphic 204, thereby allowing subsequent customization operations to be applied to details of the subject matter depicted in the input raster graphic 204. For instance, removing noise can allow subsequent edge-detection operations to focus on regions of the input raster graphic 204 that depict edges in a hazy, blurred, or other manner. In the absence of the cleaning operation 404, such edge-detection operations may overlook certain edges that are difficult to distinguish from noise, falsely classify noisy regions as having edges, or both.

In some embodiments, the graphic manipulation application 206 generates a cleaning confidence map that reflects the confidence that a pixel corresponds to background of the raster graphic data (i.e., an area of the raster graphic data that can be aggressively cleaned, as opposed to text or graphics). The graphic manipulation application 206 modifies pixels of the raster graphic data, where the modification can include noise-reduction, based on the cleaning confidence map and the determined confidence that pixels correspond to background of the raster graphic data. The graphic manipulation application 206 utilizes the cleaning confidence map to modify pixels with a high cleaning confidence value more aggressively than pixels with a low cleaning confidence value. For instance, the cleaning operation 404 performs one or more of removing shadows, cleaning background pixels, and correcting contrast based on the content of individual pixels as reflected in a cleaning confidence map. Examples of using a cleaning confidence map in this manner is described in detail in U.S. patent application Ser. No. 15/090,397, titled "Content Aware Improvement of Captured Document Images." In additional or alternative embodiments, other suitable cleaning algorithms can be used. An example of another suitable cleaning algorithm is the cleaning algorithm available in OpenCV, available at https://opencv.org.

If the "clean" candidate probability does not meet or exceed a threshold probability, the clean decision block 402 provides input graphic data to a blend decision block 406 of the boosting module 222. This input graphics data can be the input raster graphic 204 or modified graphic data generated by one or more other customization operations in the vectorization pipeline used by the vectorization algorithm 400. The blend decision block 406 determines whether the class label and probability applied to the input raster graphic 204 indicates that a blending operation should be performed. For instance, the graphic manipulation application 206 also provides a "blend" candidate probability, which is outputted from the multi-label classifier 212, to the blend decision block 406.

If the "blend" candidate probability meets or exceeds the threshold probability, the blend decision block 406 provides the input graphic data to a thin-edge detection operation 408. The thin-edge detection operation 408 applies a thin-stroke edge detection technique, such as a Canny edge-detection operator.

In some embodiments, the thin-edge detection operation 408 also performs an edge-sensitivity map computation 410 using the output of the Canny edge detector or other thin-edge detection operation 408. The edge-sensitivity map computation 410 generates or populates a data structure that identifies, for each pixel in the graphics data being processed, an edge-sensitivity value. In the regions of the graphics data where an edge has been detected by the thin-edge detection operation 408, the edge-sensitivity map computation 410 generates a set of edge-sensitivity values for various pixels, which could be the same as or different from user-selected selected edge-sensitivity values, such that the edge-sensitivity value for each pixel is suitable for an XDOG operation 422. This allows the results of a thin-stroke edge detection technique to be blended or otherwise combined with other edge-detection techniques, such as an XDOG operator, that can detect thicker edges, smudgy edges (e.g., images such as in oil paintings), etc. An example of the edge-sensitivity map computation 410 is described herein with respect to FIG. 5.

Alternatively, if the "blend" candidate probability does not meet or exceed a threshold probability, the blend decision block 406 provides the input graphic data (i.e., the input raster graphic 204 or modified graphic data from other customization operations) to a generic-customization decision block 412 of the generic-customization module 411. The generic-customization decision block 412 determines whether the class label and probability applied to the input raster graphic 204 indicates that a user-specified customization operation should be performed. The graphic manipulation application 206 provides a "generic-customization" candidate probability, which is outputted from the multi-label classifier 212, to the generic-customization decision block 412. If the "generic-customization" candidate probability meets or exceeds the threshold probability, the generic-customization decision block 412 provides the input graphic data to a generic-customization operation 414. The generic-customization operation 414 can be any suitable customization operation that a programmer or other entity can add to a vectorization pipeline. In some embodiments, the generic-customization module 411 can be omitted, and the output of the blending module 220 (e.g., either the blended or un-blended graphic data) can be provided to a boost decision block 416 of the boosting module 222.

If the "generic-customization" candidate probability does not meet or exceed a threshold probability, the generic-customization decision block 412 provides the input graphic data (i.e., the input raster graphic 204 or modified graphic data from other customization operations) to a boost decision block 416 of the boosting module 222, which uses the label and/or probability applied by the multi-label classifier to determine whether a boosting operation should be applied to the input graphic data. The graphic manipulation application 206 also provides a "boost" candidate probability, which is outputted from the multi-label classifier 212, to the boost decision block 416. If the "boost" candidate probability meets or exceeds the threshold probability, the boost decision block 416 provides the input graphic data to an edge-augmentation operation 418, such as a Sobel operator.

In some embodiments, Sobel or other edge-augmentation operation 418 uses a convolution-based, image-gradient approximation to augment a current edge-detection output at appropriate regions in the graphics data being processed. For instance, the edge-augmentation operation 418 could be used to detect faded edges for a hazy image or other hazy graphic. These faded edges may not be identifiable using an XDOG operation 422. A Sobel operator uses 3×3 convolution kernels to approximate the magnitude of gradients using the image intensity.

The edge-sensitivity value used by an edge-detection or edge-augmentation operation affects whether the edge-detection or edge-augmentation operation can identify faded edges, smudgy edges, or other edges that may be difficult to distinguish from noise. Certain edge-detection or edge-augmentation operations, such as Canny and Sobel, are able to distinguish hazy edges or smudged edges (e.g., from oil paintings, hazy images, etc.) from noise, and thereby detect the edges, at a given edge-sensitivity value. But other edge-detection or edge-augmentation operations, such as XDOG, may confuse noise with an edge using the same edge-sensitivity value. Thus, the edge-sensitivity value used by edge-detection or edge-augmentation operations may prevent (or impede) XDOG or similar operators from detecting the same edge. To leverage the advantages of XDOG or similar operators, one or more of the edge-sensitivity map computations 410 and 420 can first detect or augment edges by applying Canny, Sobel, or other operators capable of using lower edge-sensitivity values, and can subsequently compute an updated edge-sensitivity value (e.g., in the edge-sensitivity map computations 410 or 420) for use by the XDOG operator. (In other embodiments that omit the blending and boosting operations, an edge-sensitivity map could be uniform using a user-specified edge sensitivity value.)

The graphic manipulation application 206 provides, to the XDOG operation 422, a modified version of the graphics data generated by the edge-augmentation operation 418 and an edge-sensitivity map generated by an edge-sensitivity map computation 420. This edge-sensitivity map serves a similar purpose as the map generated by the edge-sensitivity map computation 410 from the blending module 220. An example of the edge-sensitivity map computation 420 is described herein with respect to FIG. 6. Alternatively, if the "boost" candidate probability does not meet or exceed a threshold probability, the boost decision block 416 provides the raster graphic data to the XDOG operation 422 without applying the edge-augmentation operation 418 or performing the edge-sensitivity map computation 420.

Returning to FIG. 4, the XDOG operation 422 processes the input graphic data (i.e., the input raster graphic 204 or modified graphic data from other customization operations) and sends the processed graphic data to a smoothing decision block 424 of the smoothing module 224, which uses the label and/or probability applied by the multi-label classifier to determine whether a smoothing operation should be applied to the input graphic data. The graphic manipulation application 206 also provides a "smoothen" candidate probability, which is outputted from the multi-label classifier 212, to the smoothing decision block 424. If the "smoothen" candidate probability meets or exceeds the threshold probability, the smoothing decision block 424 provides the input graphic data to a smoothing operation 426, such as a cornucopia smoothing algorithm. The smoothing operation 426 reduces, for at least some curves in the graphics data being processed, the number of points used to define the curve.

For instance, a particular line segment outputted by other modules in the vectorization algorithm 400 could include a large number of points (e.g., more than two points) that define multiple sub-segments of the line segment. This line segment could be more efficiently represented using only a pair of points with the line segment in between the two points. To implement this more efficient representation, the smoothing operation 426 combines the various sub-segments into one line segment, thereby removing points along the line segment other than a start point and an end point. The graphic manipulation application 206 outputs this smoothed graphics data as the output vector graphic 226. Alternatively, if the "smoothen" candidate probability does not meet or exceed the threshold probability, the graphic manipulation application 206 outputs the graphics data inputted into the smoothing decision block 424 as the output vector graphic 226, without applying the smoothing operation 426.

Edge-Sensitivity Map Computation for Blending

Figure 5:
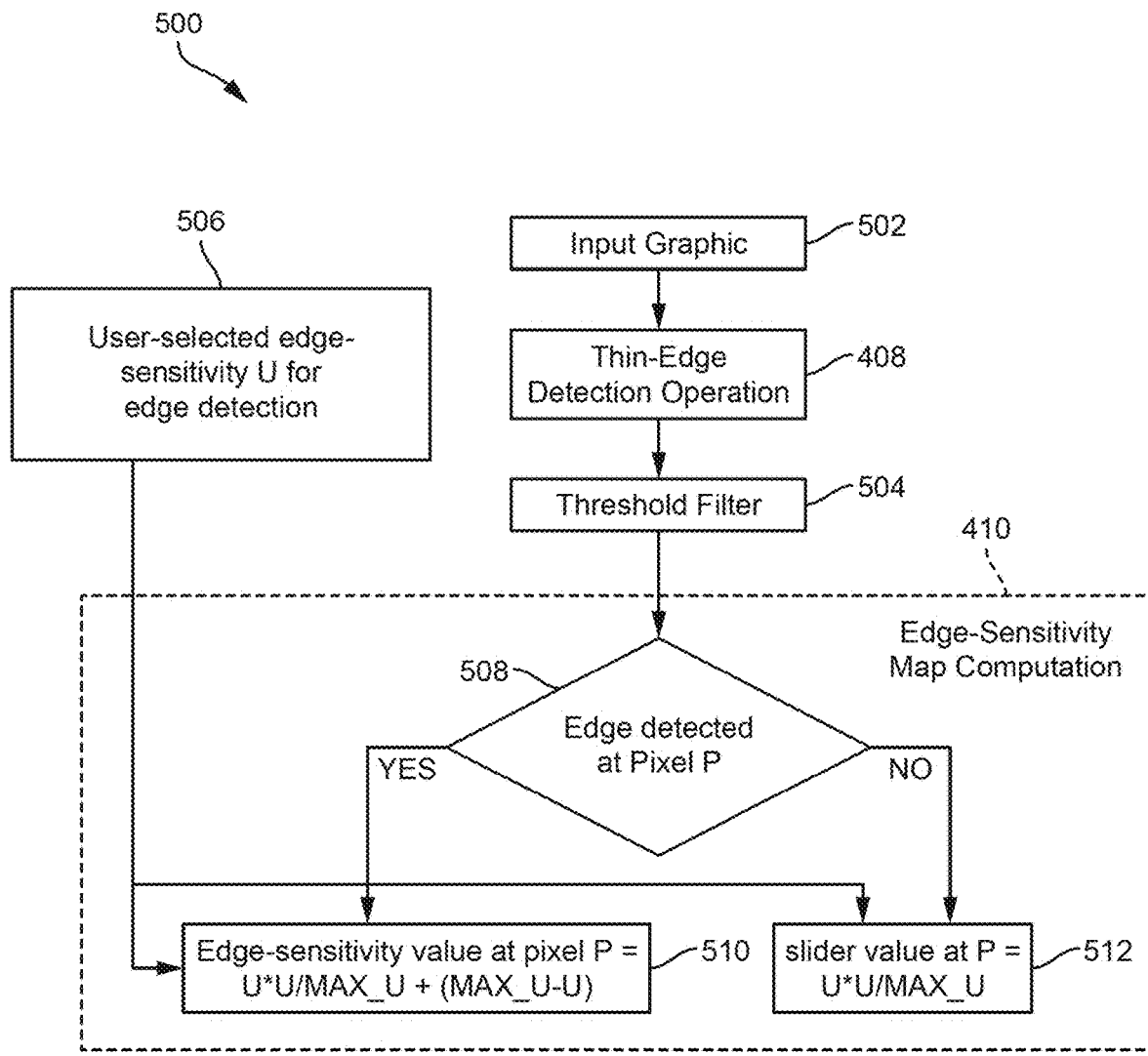
FIG. 5 depicts an example of a process for computing an edge-sensitivity map using the results of a thin-edge detection operation from the vectorization algorithm in FIG. 4, according to certain embodiments of the present disclosure.

FIG. 5 depicts an example of a process 500 that involves performing the edge-sensitivity map computation 410 for a blending operation. In the process 500, the graphic manipulation application 206 provides input graphics data 502 (e.g., an input raster graphic 204 or a modified version generated by the vectorization pipeline of FIG. 4) as an input to the thin-edge detection operation 408.

The graphic manipulation application 206 applies a threshold filtering operation 504 to the output of the thin-edge detection operation 408. In some embodiments, the threshold filtering operation 504 can apply a numerical value chosen by a programmer or other user for each of the customization operations that classifies the output probability. For example, a threshold probability of 0.5 could be used to determine if the given operation should be applied. In additional or alternative embodiments, the threshold filtering operation 504 can apply a binary classifier that is trained using the given training data 230 and appropriate customization operations. In these embodiments, the multi-label classifier 212 is cascaded by a parallel set of linear classifiers for each of the customization operations.

The graphic manipulation application 206 also receives, at block 506, a user-specified edge-sensitivity value that controls the sensitivity of an edge detection operation. The user-specified edge-sensitivity value is designated as U, and a maximum edge-sensitivity value is designated as MAX_U. The maximum edge-sensitivity value MAX_U can be vary between different graphic manipulation applications 206, and can be identified as a process 500 by accessing data identifying a range of edge-sensitivity values for the graphic manipulation application 206. In some embodiments, the maximum edge-sensitivity value is dependent on the edge detection filter. A maximum edge-sensitivity value can be an edge-sensitivity value that provides maximum edges/contours for the use case of a specified application (e.g., 0.03 for XDOG, which is used in running blur cutoff).

Continuing with this example, the edge-sensitivity map computation 410 involves, for each pixel P in the input graphics data, executing a decision block 508 to perform one or more of blocks 510 and 512. At the decision block 508, the graphic manipulation application 206 determines whether an edge has been detected at the pixel P using a Canny edge operator or other thin-edge detection operation 408.

If the thin-edge detection operation 408 detects an edge at the decision block 508, the graphic manipulation application 206 executes block 510. Block 510 involves modifying the edge-sensitivity map so that the pixel P is associated with an edge-sensitivity value of $U \times U/MAX\_U + (MAX\_U - U)$. This edge-sensitivity value in the map, which could be different from the user-selected edge-sensitivity value received at block 506, gives a proportional weight to the output of a Canny edge detector or other thin-edge detection operation 408. Thus, the edge-detection performed by the thin-edge detection operation 408, which uses the user-selected edge-sensitivity value from block 506, is proportionally blended with a separate edge detection that could be performed by an XDOG operation 422. This blending allows thin strokes at low edge-sensitivity values to be detected by the thin-edge detection operation 408, prior to the graphics data being provided to the XDOG operation 422, and also allows similar fidelity to be maintained at higher edge-sensitivity values used by the XDOG operation 422.

The following examples provide use cases with respect to block 510. In one example, the used-selected edge-sensitivity from block 506 is at or near zero for pixel P. If an edge is detected at this pixel by the thin-edge detection operation 408, the graphic manipulation application 206 uses a different edge-sensitivity value in the edge-sensitivity map for this pixel, where the different edge-sensitivity value that is (0×0)/MAX_U+(MAX_U−0)=MAX_U. This increased edge-sensitivity value for the pixel in the map prior is usable by the XDOG operation 422. For instance, the XDOG operation 422 is able to detect this edge (using the modified edge-sensitivity value) even if the user-specified edge-sensitivity value from block 506 would otherwise be too low for the XDOG operation 422 to detect the edge.

In another example, the user-specified edge-sensitivity value of U received at block 506 for pixel P is at or near MAX_U. If an edge is detected at this pixel by the thin-edge detection operation 408, the same edge-sensitivity value for this pixel is stored in the map, since (MAX_U×MAX_U)/MAX_U+(MAX_U−MAX_U)=MAX_U. The edge-sensitivity value for the pixel is maintained because the XDOG operation 422 can detect darker regions. Therefore, the output of the thin-edge detection operation 408 does not cause a change in the edge-sensitivity value, since changing the edge-sensitivity value would result in darkening a region of interest.

In another example, the user-specified edge-sensitivity value of U received at block 506 for pixel P is U=0.5× MAX_U/2. If an edge is detected by the thin-edge detection operation 408, the edge-sensitivity value for that pixel in the map is set to $$\frac{0.5 \times MAX\_U \times 0.5 \times MAX\_U}{MAX\_U} + (MAX\_U - 0.5 \times MAX\_U) = 0.75 \times MAX\_U.$$

Alternatively, if the thin-edge detection operation 408 does not detect an edge at the decision block 508, the graphic manipulation application 206 executes block 512. At block 512, the edge-sensitivity value at pixel P is set to U×U/MAX_U. If the edge-sensitivity value of U for pixel P from block 506 is at MAX_U, block 512 maintains the edge-sensitivity value (i.e., MAX_U×MAX_U/MAX_U=MAX_U). For other non-zero edge-sensitivity values from block 506, block 512 decreases the edge-sensitivity value. For instance, if the edge-sensitivity value of U for pixel P from block 506 is at 0.5×MAX_U, block 512 decreases this value to $$\frac{0.5 \times MAX\_U \times 0.5 \times MAX\_U}{MAX\_U} = 0.25 \times MAX\_U.$$

Edge-Sensitivity Map Computation for Boosting

Figure 6:
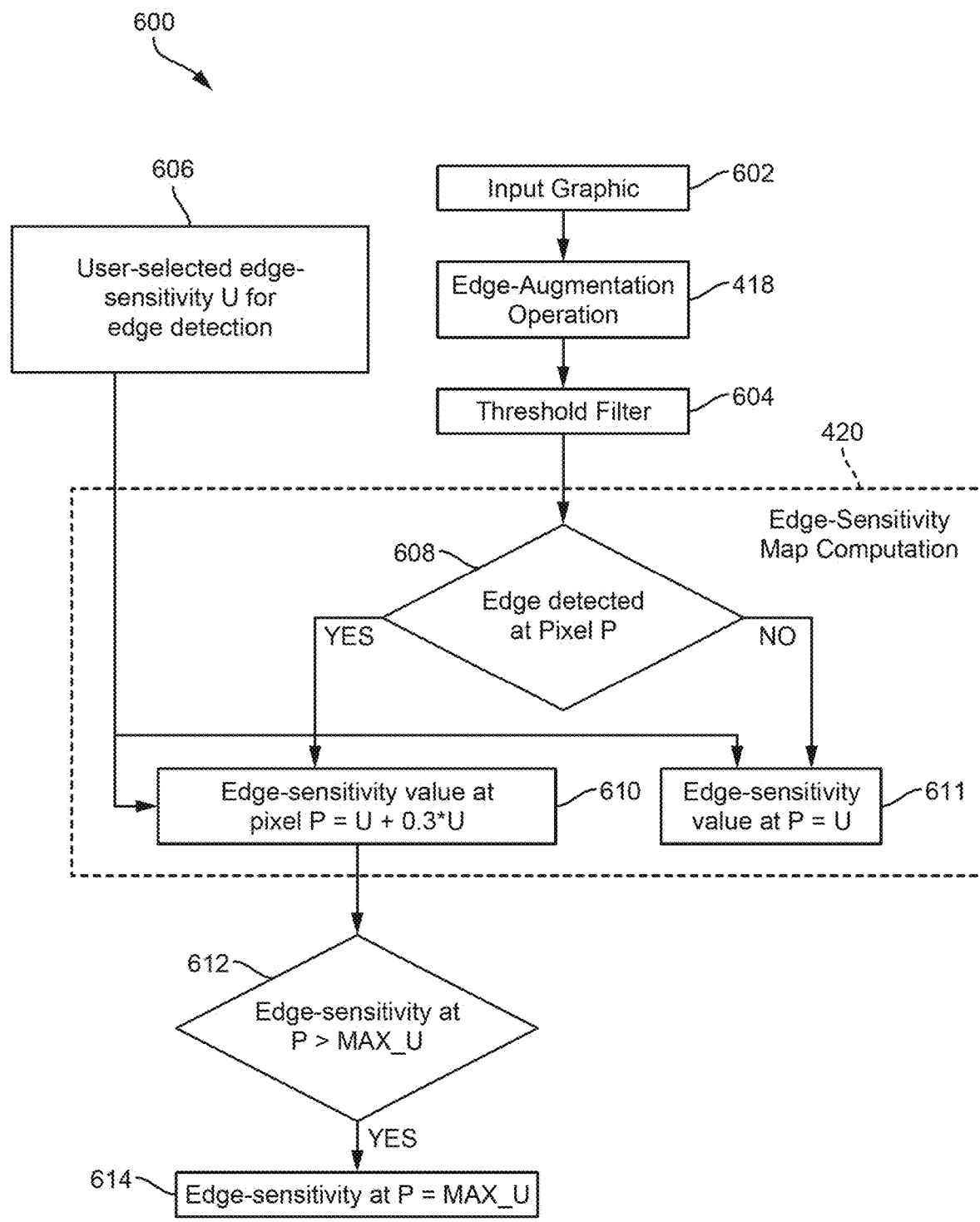
FIG. 6 depicts an example of a process for computing an edge-sensitivity map using the results of an edge augmentation operation from the vectorization algorithm in FIG. 4, according to certain embodiments of the present disclosure.

FIG. 6 depicts an example of a process 600 that includes the edge-sensitivity map computation 420 for a boosting operation. In the process 600, the graphic manipulation application 206 provides input graphics data 602 (e.g., an input raster graphic 204 or a modified version generated by the vectorization pipeline of FIG. 4) as an input to the edge-augmentation augmentation operation 418. The graphic manipulation application 206 applies a threshold filtering operation 604 to the output of the edge-augmentation operation 418. The threshold filtering operation 604 can be implemented in a manner similar to the threshold filtering operation 504 described above with respect to FIG. 5. The graphic manipulation application 206 also receives, at block 606, a user-specified edge-sensitivity value. The user-specified edge-sensitivity value controls the sensitivity of the edge-augmentation operation 418. The user-specified edge-sensitivity value is designated as U.

In this example, the edge-sensitivity map computation 420 involves, for each pixel P in the input graphics data, executing a decision block 608 and performing one or more of blocks 610 and 612 to generate a corresponding edge-sensitivity value in an edge-sensitivity map.

At the decision block 608, the graphic manipulation application 206 determines whether an edge has been detected at the pixel P using a Sobel operator or other edge-augmentation operation 418. If so, the graphic manipulation application 206 executes block 610, which involves increasing the edge-sensitivity value for the pixel P beyond the user-specified edge-sensitivity value U (e.g., increasing U by 30%, as in FIG. 6, or increasing U by some other suitable value).

At decision block 612, the graphic manipulation application 206 further determines whether the augmented edge-sensitivity value (e.g., 1.3×U) for the pixel P exceeds the maximum edge-sensitivity value specified for a certain graphic manipulation application 206. If so, the graphic manipulation application 206 reduces the augmented edge-sensitivity value to the maximum edge-sensitivity value MAX_U, as depicted at block 614. If not, the augmented edge-sensitivity value is used in the edge-sensitivity map for that pixel P.

Alternatively, if the graphic manipulation application 206 determines at block 608 that no edge has been detected at the pixel P, the graphic manipulation application sets the edge-sensitivity value to the user-specified slide value U for that pixel in the edge-sensitivity map. The graphic manipulation application 206 provides the boosted graphics and the calculated edge-sensitivity map to the XDOG operation 422.

For illustrative purposes, FIG. 6 depicts the edge-sensitivity value as being increased by 30%. But any percentage can be used that enhances the ability of an XDOG operation to detect edges that have been augmented using the edge-augmentation operation 418.

Examples of User Feedback for Refining the Customization-Identification Network

Figure 7:
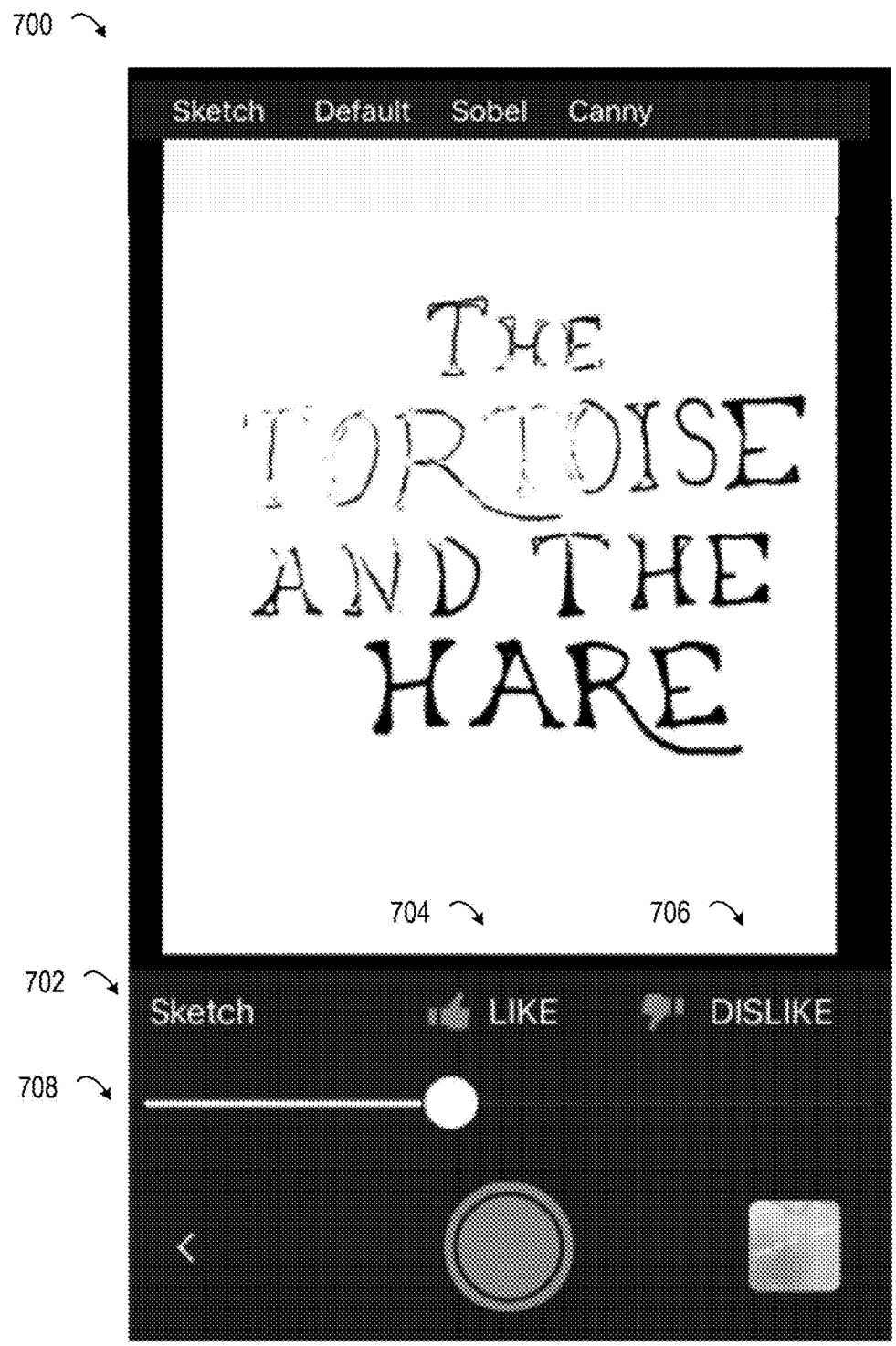
FIG. 7 depicts an example of an interface for providing user feedback on an output vector graphic generated by the vectorization algorithm in FIG. 4, according to certain embodiments of the present disclosure.

The computing device at which the output vector graphic 226 is displayed (e.g., the user device 227) can receive the user feedback data 240 via the client application 229. For instance, FIG. 7 depicts an example of an interface 700 displayed by a client application 229 at a user device 227. In this example, the interface displays a tag 702 that indicates a set of customization operations performed by the vectorization algorithm 400, a "like" button 704, a "dislike" button 706, and an edge-sensitivity 708. For instance, after an input raster graphic has been classified and customized by the graphic manipulation application 206, the graphic manipulation application 206 updates the interface to include a tag 702 corresponding to the applied pipeline. For example, the "sketch" label in tag 702 indicates that a certain set of customization operations have been applied by the vectorization algorithm 400. The interface 700 also provides an option (i.e., a "default" button) to revert the classification decision (i.e., to undo the set of customization operations applied using the customization-identification network 208).

The user device 227 captures one or more user inputs data indicating an applicability of one or more customizations selected by the customization-identification network 208. An applicability of a customization is a degree to which a particular type of input raster graphic is a suitable candidate for the customization. The user feedback data 240 can be used by a training system (e.g., the content-creation computing system 202) to refine the training of the customization-identification network 208 (e.g., by adjusting one or more of the set of hidden layers in the hidden-layer architecture 210, by adjusting the multi-label classifier, etc.).

The content-creation computing system 202 (or another computing system for training the customization-identification network 208) receives the user feedback data 240 from the user device 227. The applicability of one or more customizations is determined based on one or more user feedback inputs indicating the output vector graphic 226 as being aesthetically pleasing to one or more users.

In some embodiments, this training system receives explicit user feedback indicating an applicability of one or more customizations to a given input raster graphic. For instance, if the "sketch" pipeline (i.e., a particular set of customizations) resulted in an aesthetically pleasing output vector graphic 226, the user device 227 could receive a selection of the "like" button 704. The selection of the "like" button 704 indicates that the customizations selected by the customization-identification network 208 were accurately selected (i.e., were applicable to the input raster graphic 204). Alternatively, if the "sketch" pipeline (i.e., a particular set of customizations) did not result in an aesthetically pleasing output vector graphic 226, the user device 227 could receive a selection of the "dislike" button 706. The selection of the "dislike" button 706 indicates that at least some of the customizations selected by the customization-identification network 208 were not accurately selected (i.e., were not applicable to the input raster graphic 204).

In additional or alternative embodiments, the training system receives implicit user feedback indicating an applicability of one or more customizations to a given input raster graphic. For instance, user activity such as an input saving the output vector graphic 226 with few or no additional modifications could indicate that the output vector graphic 226 is aesthetically pleasing to the user. This "save" input is therefore captured as positive user feedback data 240. Additionally or alternatively, user activity such as an input declining an option to save the output vector graphic 226 or inputs that perform significant additional modifications to the output vector graphic 226 could indicate that the output vector graphic 226 is not aesthetically pleasing to the user. These inputs are therefore captured as negative user feedback data 240.

Example of a Computing System for Customized Vectorization Operations

Figure 8:
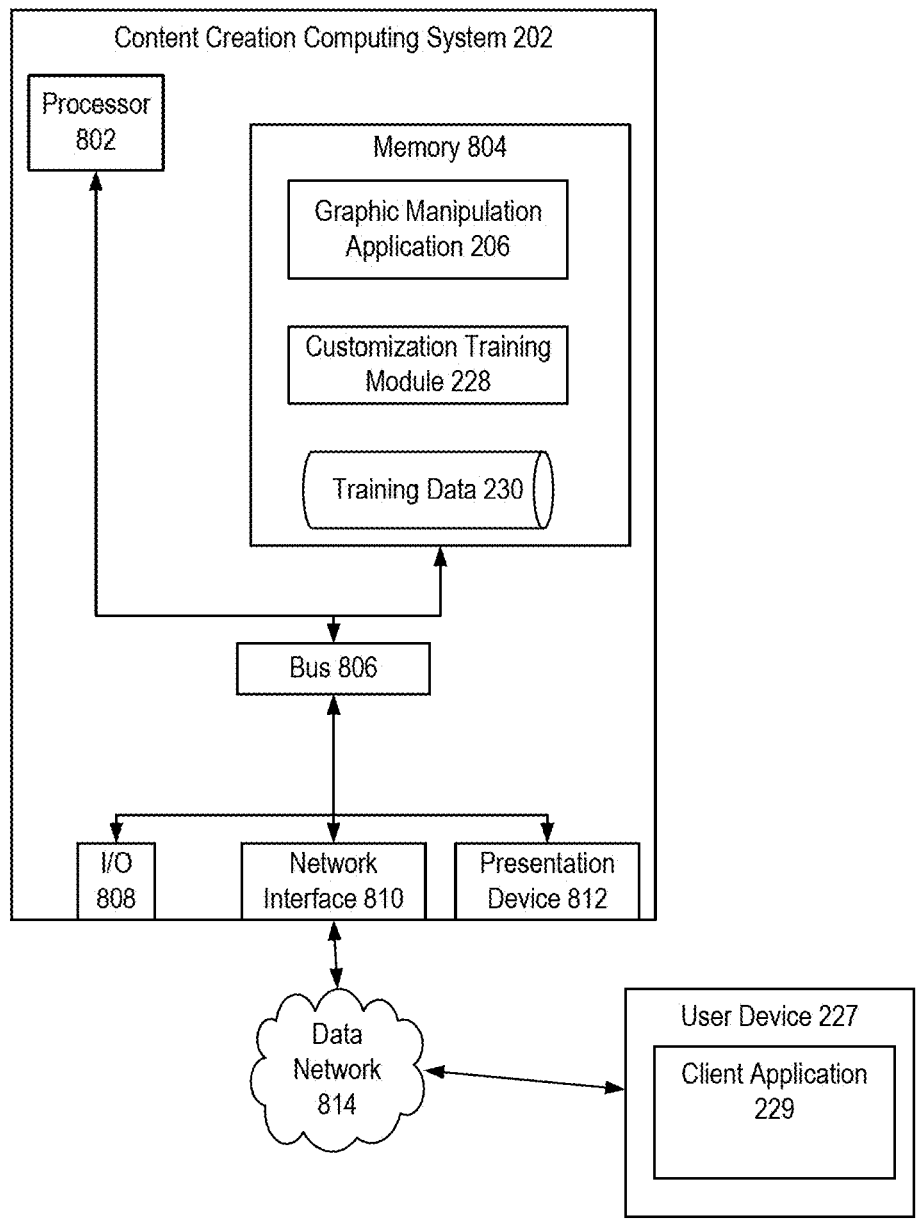
FIG. 8 depicts an example of a computing system that applies style features from multi-resolution style exemplars to input raster graphics, according to certain embodiments of the present disclosure.

Any suitable computing system or group of computing systems can be used for performing the operations described herein. For example, FIG. 8 depicts an example of the content-creation computing system 202 that executes a graphic manipulation application 206. In some embodiments, the content-creation computing system 202 also executes the customization training module 228, as depicted in FIG. 8. In other embodiments, a separate computing system having devices similar to those depicted in FIG. 8 (e.g., a processor, a memory, etc.) executes the customization training module 228.

The depicted example of a content-creation computing system 202 includes a processor 802 communicatively coupled to one or more memory devices 804. The processor 802 executes computer-executable program code stored in a memory device 804, accesses information stored in the memory device 804, or both. Examples of the processor 802 include a microprocessor, an application-specific integrated circuit ("ASIC"), a field-programmable gate array ("FPGA"), or any other suitable processing device. The processor 802 can include any number of processing devices, including a single processing device.

The memory device 804 includes any suitable non-transitory computer-readable medium for storing data, program code, or both. A computer-readable medium can include any electronic, optical, magnetic, or other storage device capable of providing a processor with computer-readable instructions or other program code. Non-limiting examples of a computer-readable medium include a magnetic disk, a memory chip, a ROM, a RAM, an ASIC, optical storage, magnetic tape or other magnetic storage, or any other medium from which a processing device can read instructions. The instructions may include processor-specific instructions generated by a compiler or an interpreter from code written in any suitable computer-programming language, including, for example, C, C++, C#, Visual Basic, Java, Python, Perl, JavaScript, and ActionScript.

The content-creation computing system 202 may also include a number of external or internal devices, such as input or output devices. For example, the content-creation computing system 202 is shown with one or more input/output ("I/O") interfaces 808. An I/O interface 808 can receive input from input devices or provide output to output devices, such as a presentation device 812. One or more buses 806 are also included in the content-creation computing system 202. The bus 806 communicatively couples one or more components of a respective one of the content-creation computing system 202.

The content-creation computing system 202 executes program code that configures the processor 802 to perform one or more of the operations described herein. The program code includes, for example, the graphic manipulation application 206, the customization training module 228, or other suitable applications that perform one or more operations described herein. The program code may be resident in the memory device 804 or any suitable computer-readable medium and may be executed by the processor 802 or any other suitable processor. In some embodiments, both the graphic manipulation application 206 and the customization training module 228 are stored in the memory device 804, as depicted in FIG. 8. In additional or alternative embodiments, one or more of the graphic manipulation application 206 and the customization training module 228 are stored in different memory devices of different computing systems. In additional or alternative embodiments, the program code described above is stored in one or more other memory devices accessible via a data network.

The content-creation computing system 202 can access one or more of the customization-identification network 208 and the training data 230 in any suitable manner. In some embodiments, some or all of one or more of these data sets, models, and functions are stored in the memory device 804, as in the example depicted in FIG. 8. For example, a content-creation computing system 202 that executes the customization training module 228 can provide access to the customization-identification network 208 by external systems that execute the graphic manipulation application 206.

In additional or alternative embodiments, one or more of these data sets, models, and functions are stored in the same memory device (e.g., one of the memory device 804). For example, a common computing system, such as the content-creation computing system 202 depicted in FIG. 2, can host the graphic manipulation application 206, the customization-identification network 208, and the customization training module 228. In additional or alternative embodiments, one or more of the programs, data sets, models, and functions described herein are stored in one or more other memory devices accessible via a data network.

The content-creation computing system 202 also includes a network interface device 810. The network interface device 810 includes any device or group of devices suitable for establishing a wired or wireless data connection to one or more data networks 814, via which communications with a user device 227 can occur. Non-limiting examples of the network interface device 810 include an Ethernet network adapter, a modem, and/or the like. The content-creation computing system 202 is able to communicate with one or more other computing devices (e.g., a user device 227 executing a client application or a graphic manipulation application) via a data network 814 using the network interface device 810.

In some embodiments, the content-creation computing system 202 also includes the presentation device 812 depicted in FIG. 8. A presentation device 812 can include any device or group of devices suitable for providing visual, auditory, or other suitable sensory output. Non-limiting examples of the presentation device 812 include a touchscreen, a monitor, a speaker, a separate mobile computing device, etc. In some aspects, the presentation device 812 can include a remote client-computing device that communicates with the content-creation computing system 202 using one or more data networks described herein. Other aspects can omit the presentation device 812.

Examples of Experimental Results

Figure 9:
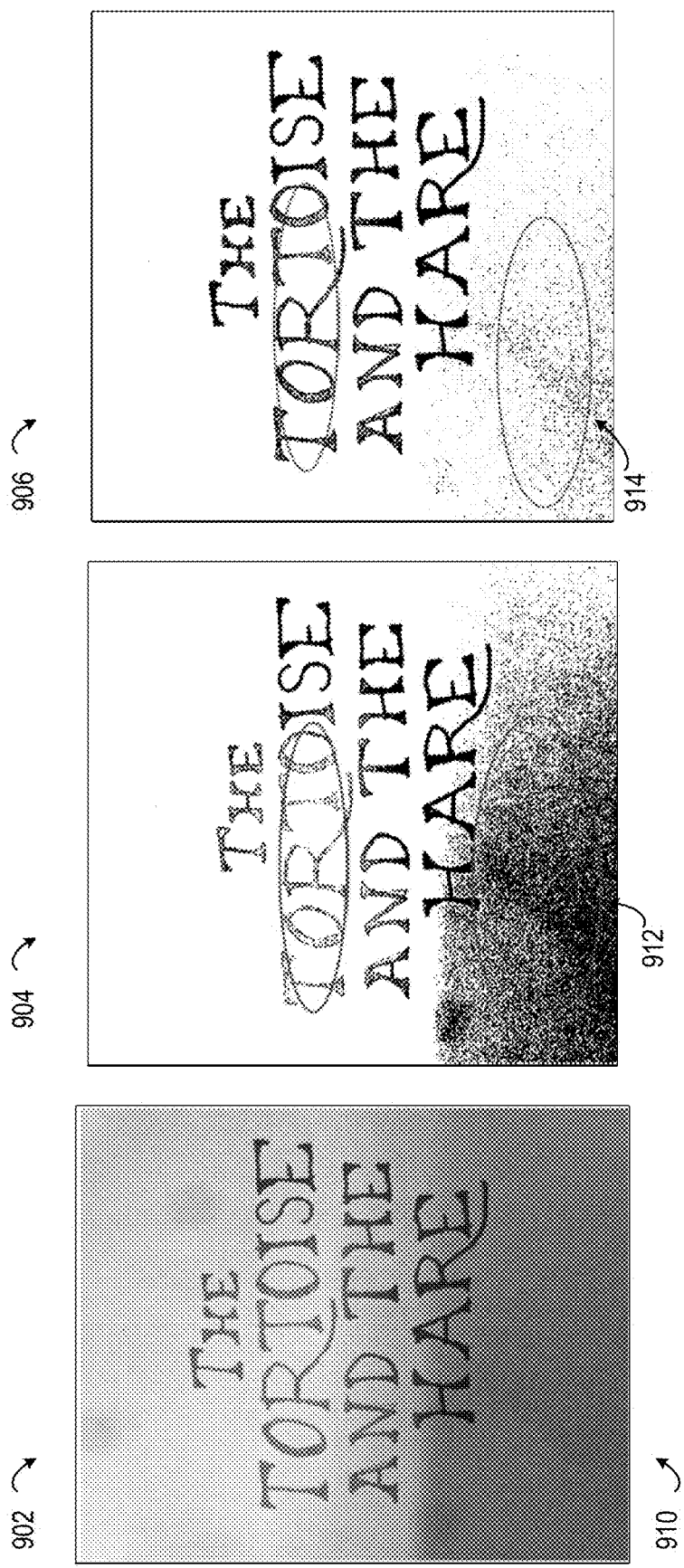
FIG. 9 depicts an example that compares results of vectorising a hand-drawn sketch using customization-identification networks to results from existing vectorization solutions, according to certain embodiments of the present disclosure.
Figure 10:
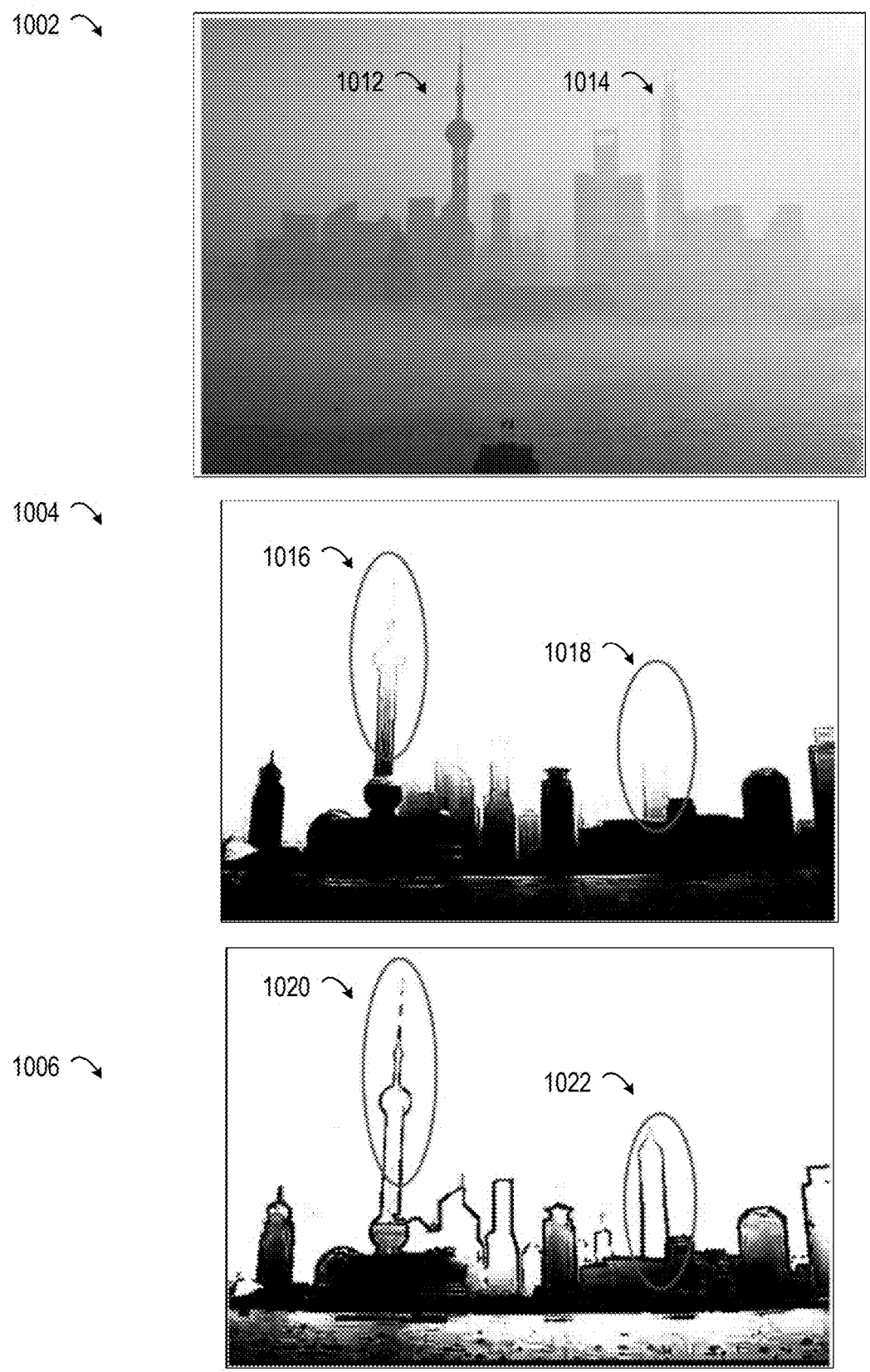
FIG. 10 depicts an example that compares results of vectorising a hazy image using customization-identification networks to results from existing vectorization solutions, according to certain embodiments of the present disclosure.
Figure 11:
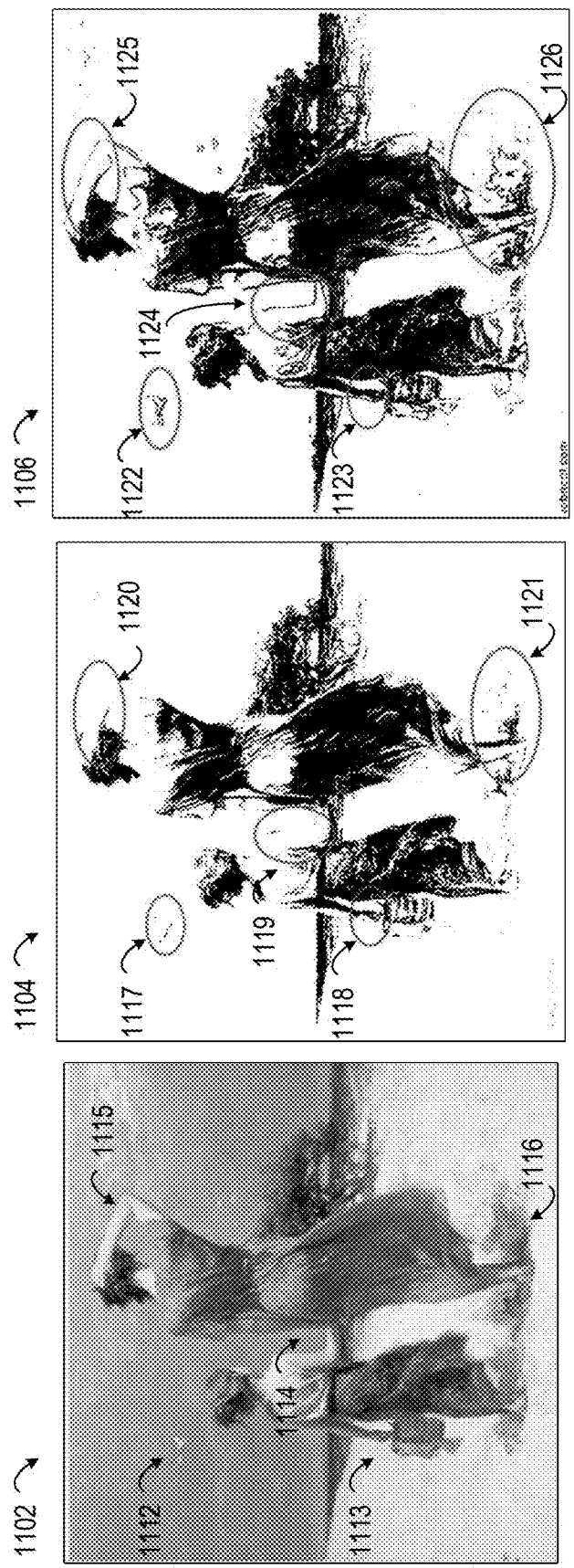
FIG. 11 depicts an example that compares results of vectorising an oil painting using customization-identifica-

FIGS. 9-11 depict results from experiments involving certain embodiments of the customization-identification network 208 described herein. For instance, FIG. 9 depicts an example that compares results 906 of vectorising a hand-drawn sketch 902 using customization-identification networks to results 904 from existing vectorization solutions.

As depicted in FIG. 9, the shadow 910 from the hand-drawn sketch 902 (i.e., an input raster graphic) results in region 912 obscuring more of the relevant semantic content from the input. By contrast, in the results 904 from the customization-identification network, the region 914 reproduces the semantic content of the input raster graphic (e.g., the edges of the hand-drawn letters) without reproducing as much of the shadow that obscures this semantic content.

FIG. 10 depicts an example that compares results 1006 of vectorising a hazy image 1002 using customization-identification networks to results 1004 from existing vectorization solutions. As depicted in FIG. 10, the regions 1012 and 1014 from the hazy image 1002 (i.e., an input raster graphic) are not accurately reproduced in regions 1016 and 1018, which are generated without a customization-identification network and lack some of the required semantic detail from the input raster graphic. By contrast, the regions 1012 and 1014 from the hazy image 1002 are more accurately reproduced in regions 1020 and 1022, which are generated using a customization-identification network and include edges that were not captured in the results 1004.

FIG. 11 depicts an example that compares results 1106 of vectorising an oil painting 1102 using customization-identification networks to results 1104 from existing vectorization solutions, according to certain embodiments of the present disclosure. As depicted in FIG. 11, the regions 1112-1116 from the oil painting 1102 (i.e., an input raster graphic) are not accurately reproduced in regions 1117-1121, which are generated without a customization-identification network and lack some of the required semantic detail from the input raster graphic. By contrast, the regions 1112-1116 from the oil painting 1102 are more accurately reproduced in regions 1122-1126, which are generated using a customization-identification network and include edges that were not captured in the results 1104.

General Considerations

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provide a result conditioned on one or more inputs. Suitable computing devices include multi-purpose microprocessor-based computer systems accessing stored software that programs or configures the computing system from a general purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude the inclusion of such modifications, variations, and/or additions to the present subject matter as would be readily apparent to one of ordinary skill in the art.

The invention claimed is:

1. A method performed by a content-creation computing system having one or more processing devices that execute a graphic manipulation application, the method comprising:
   accessing an input raster graphic from a memory device;
   transforming, by the content-creation computing system, the input raster graphic into a output vector graphic by applying a customization specific to visual characteristics of the input raster graphic, wherein applying the customization comprises:
      providing the input raster graphic to a customization-identification network having a multi-label classifier,
      generating, by the multi-label classifier, a first probability that a first customization operation is applicable to the input raster graphic and a second probability that a second customization operation is applicable to the input raster graphic, wherein the first probability is greater than the second probability,
      selecting the first customization operation as the customization specific to the input raster graphic, and
      executing a vectorization algorithm that performs the first customization operation using the input raster graphic as an input; and
   causing, by the content-creation computing system, a computing device to display the output vector graphic generated by executing the vectorization algorithm.

2. The method of claim 1, wherein the customization-identification network is trained to generate probabilities of input raster graphics being candidates for two or more of a cleaning customization operation, a boosting customization operation, a blending customization operation, a smoothing customization operation, and a user-specified customization operation,
   wherein the first customization operation is one of the two or more of the cleaning customization operation, the boosting customization operation, the blending customization operation, the smoothing customization operation, and the user-specified customization operation,
   wherein the second customization operation is a different one of the two or more of the cleaning customization operations, the boosting customization operation, the blending customization operation, the smoothing customization operation, and the user-specified customization operation.

3. The method of claim 2, further comprising training the customization-identification network by performing, by the content-creation computing system and prior to transforming the input raster graphic, operations comprising:
   accessing training graphics labeled as clean candidate exemplars, boost candidate exemplars, blend candidate exemplars, and smoothen candidate exemplars,
   providing the training graphics to a set of hidden layers in the customization-identification network,
   applying training labels to the training graphics with the multi-label classifier following the set of hidden layers, and
   adjusting one or more of the set of hidden layers and the multi-label classifier based on at least some of the training labels being inaccurate for at least some of the training graphics.

4. The method of claim 3, wherein training the customization-identification network further comprises performing, by the content-creation computing system and subsequent to transforming the input raster graphic, additional operations comprising:
   receiving, from the computing device, user feedback data indicating an applicability of the customization selected by the customization-identification network, and
   adjusting one or more of the set of hidden layers and the multi-label classifier based on the user feedback data.

5. The method of claim 1, wherein the customization specific to the input raster graphic comprises, for input graphic data that includes or is derived from the input raster graphic:
   receiving a user input identifying a user-specified edge-sensitivity value;
   detecting, at a particular pixel of input graphic data, an edge by applying an edge-detection operation or an edge-augmentation operation with the user-specified edge-sensitivity value, wherein the edge-detection operation or the edge-augmentation operation distinguishes the edge from noise at the user-specified edge-sensitivity value, wherein the user-specified edge-sensitivity value prevents a difference-of-Gaussians operation from detecting the edge;
   computing, based on detecting the edge, an updated edge-sensitivity value for the particular pixel, wherein an application of the difference-of-Gaussians operation with the updated edge-sensitivity value for the particular pixel allows the difference-of-Gaussians operation to detect the edge; and
   modifying an edge-sensitivity map having edge-sensitivity values for pixels in the input graphic data to include the edge-sensitivity value for the particular pixel,
   wherein the vectorization algorithm further comprises applying, to graphics data generated from the edge-detection operation, the difference-of-Gaussians operation using the edge-sensitivity values for respective pixels in the graphics data.

6. The method of claim 5, wherein the customization specific to the input raster graphic comprises the edge-detection operation and wherein computing the updated edge-sensitivity value comprises:
   calculating a first term from a square of the user-specified edge-sensitivity value divided by a maximum edge-sensitivity value available to the graphic manipulation application;
   calculating a second term from a difference of the user-specified edge-sensitivity value and the maximum edge-sensitivity value; and
   setting the updated edge-sensitivity value to a sum of at least the first term and the second term.

7. The method of claim 5, wherein the customization specific to the input raster graphic comprises the edge-augmentation operation and wherein computing the updated edge-sensitivity value comprises:
   computing an interim value from a sum of (i) a percentage of the user-specified edge-sensitivity value and (ii) the user-specified edge-sensitivity value;
   determining if the interim value exceeds a maximum edge-sensitivity value available to the graphic manipulation application; and performing one of:
setting the updated edge-sensitivity value to the interim value if the interim value is less than or equal to the maximum edge-sensitivity value,
setting the updated edge-sensitivity value to the maximum edge-sensitivity value if the interim value is greater than the maximum edge-sensitivity value.

8. The method of claim 1, wherein transforming the input raster graphic into the output vector graphic further comprises:
generating, by the multi-label classifier, a third probability that a third customization operation is applicable to the input raster graphic;
selecting the third customization operation based on the third probability being greater than or equal to a threshold probability; and
including the third customization operation in the vectorization algorithm, wherein the vectorization algorithm comprises an ordered set of customizations comprising the first customization operation and the third customization operation.

9. A content-creation computing system comprising:
a processing device; and
a non-transitory computer-readable medium communicatively coupled to the processing device, wherein the processing device is configured to execute program code of a graphic manipulation application stored in the non-transitory computer-readable medium and thereby perform operations comprising:
transforming, by the content-creation computing system, an input raster graphic into a output vector graphic by applying a customization specific to visual characteristics of the input raster graphic, wherein applying the customization comprises:
providing the input raster graphic to a customization-identification network having a multi-label classifier,
generating, by the multi-label classifier, a first probability that a first customization operation is applicable to the input raster graphic and a second probability that a second customization operation is applicable to the input raster graphic, wherein the first probability is greater than the second probability,
selecting the first customization operation as the customization specific to the input raster graphic, and
executing a vectorization algorithm that performs the first customization operation using the input raster graphic as an input; and
outputting the output vector graphic generated by executing the vectorization algorithm.

10. The content-creation computing system of claim 9, wherein the content-creation computing system is configured for training the customization-identification network to generate probabilities of input raster graphics being candidates for two or more of a cleaning customization operation, a boosting customization operation, a blending customization operation, a smoothing customization operation, and a user-specified customization operation,
wherein the first customization operation is one of the two or more of the cleaning customization operation, the boosting customization operation, the blending customization operation, the smoothing customization operation, and the user-specified customization operation,
wherein the second customization operation is a different one of the two or more of the cleaning customization operations, the boosting customization operation, the blending customization operation, the smoothing customization operation, and the user-specified customization operation.

11. The content-creation computing system of claim 10, wherein training customizes performing, prior to transforming the input raster graphic, additional operations comprising:
accessing training graphics labeled as clean candidate exemplars, boost candidate exemplars, blend candidate exemplars, and smoothen candidate exemplars,
providing the training graphics to a set of hidden layers in the customization-identification network,
applying training labels to the training graphics with the multi-label classifier following the set of hidden layers, and
adjusting one or more of the set of hidden layers and the multi-label classifier based on at least some of the training labels being inaccurate for at least some of the training graphics.

12. The content-creation computing system of claim 11, wherein training the customization-identification network further comprises, subsequent to transforming the input raster graphic:
receiving, from a client computing device, user feedback data indicating an applicability of the customization selected by the customization-identification network, and
adjusting one or more of the set of hidden layers and the multi-label classifier based on the user feedback data.

13. The content-creation computing system of claim 9, wherein the customization specific to the input raster graphic comprises, for input graphic data that includes or is derived from the input raster graphic:
receiving a user input identifying a user-specified edge-sensitivity value;
detecting, at a particular pixel of input graphic data, an edge by applying an edge-detection operation or an edge-augmentation operation with the user-specified edge-sensitivity value, wherein the edge-detection operation or the edge-augmentation operation distinguishes the edge from noise at the user-specified edge-sensitivity value, wherein the user-specified edge-sensitivity value prevents a difference-of-Gaussians operation from detecting the edge;
computing, based on detecting the edge, an updated edge-sensitivity value for the particular pixel, wherein an application of the difference-of-Gaussians operation with the updated edge-sensitivity value for the particular pixel allows the difference-of-Gaussians operation to detect the edge; and
modifying an edge-sensitivity map having edge-sensitivity values for pixels in the input graphic data to include the edge-sensitivity value for the particular pixel,
wherein the vectorization algorithm further comprises applying, to graphics data generated from the edge-detection operation, the difference-of-Gaussians operation using the edge-sensitivity values for respective pixels in the graphics data.

14. The content-creation computing system of claim 13, wherein the customization specific to the input raster graphic comprises the edge-detection operation and wherein computing the updated edge-sensitivity value comprises:

calculating a first term from a square of the user-specified edge-sensitivity value divided by a maximum edge-sensitivity value available to the graphic manipulation application;

calculating a second term from a difference of the user-specified edge-sensitivity value and the maximum edge-sensitivity value; and setting the updated edge-sensitivity value to a sum of at least the first term and the second term.

15. The content-creation computing system of claim 13, wherein the customization specific to the input raster graphic comprises the edge-augmentation operation and wherein computing the updated edge-sensitivity value comprises:

computing an interim value from a sum of (i) a percentage of the user-specified edge-sensitivity value and (ii) the user-specified edge-sensitivity value;

determining if the interim value exceeds a maximum edge-sensitivity value available to the graphic manipulation application; and performing one of:
setting the updated edge-sensitivity value to the interim value if the interim value is less than or equal to the maximum edge-sensitivity value,
setting the updated edge-sensitivity value to the maximum edge-sensitivity value if the interim value is greater than the maximum edge-sensitivity value.

16. A non-transitory computer-readable medium having program code of a graphic manipulation application that is stored thereon, the program code executable by one or more processing devices for performing operations comprising:

accessing an input raster graphic from a memory device;

a step for transforming the input raster graphic into a output vector graphic by applying a customization specific to visual characteristics of the input raster graphic, wherein applying the customization comprises:

providing the input raster graphic to a customization-identification network having a multi-label classifier, generating, by the multi-label classifier, a first probability that a first customization operation is applicable to the input raster graphic and a second probability that a second customization operation is applicable to the input raster graphic, wherein the first probability is greater than the second probability, selecting the first customization operation as the customization specific to the input raster graphic, and executing a vectorization algorithm that performs the first customization operation using the input raster graphic as an input; and a step for outputting the output vector graphic generated by executing the vectorization algorithm.

17. The non-transitory computer-readable medium of claim 16, wherein the customization-identification network is trained to generate probabilities of input raster graphics being candidates for two or more of a cleaning customization operation, a boosting customization operation, a blending customization operation, a smoothing customization operation, and a user-specified customization operation, wherein the first customization operation is one of the two or more of the cleaning customization operation, the boosting customization operation, the blending customization operation, the smoothing customization operation, and the user-specified customization operation, wherein the second customization operation is a different one of the two or more of the cleaning customization operations, the boosting customization operation, the blending customization operation, the smoothing customization operation, and the user-specified customization operation wherein training the customization-identification network comprises performing, prior to transforming the input raster graphic, additional operations comprising:

accessing training graphics labeled as clean candidate exemplars, boost candidate exemplars, blend candidate exemplars, and smoothen candidate exemplars, providing the training graphics to a set of hidden layers in the customization-identification network, applying training labels to the training graphics with the multi-label classifier following the set of hidden layers, and adjusting one or more of the set of hidden layers and the multi-label classifier based on at least some of the training labels being inaccurate for at least some of the training graphics.

18. The non-transitory computer-readable medium of claim 16, wherein the customization specific to the input raster graphic comprises, for input graphic data that includes or is derived from the input raster graphic:

receiving a user input identifying a user-specified edge-sensitivity value;

detecting, at a particular pixel of input graphic data, an edge by applying an edge-detection operation or an edge-augmentation operation with the user-specified edge-sensitivity value, wherein the edge-detection operation or the edge-augmentation operation distinguishes the edge from noise at the user-specified edge-sensitivity value, wherein the user-specified edge-sensitivity value prevents a difference-of-Gaussians operation from detecting the edge;

computing, based on detecting the edge, an updated edge-sensitivity value for the particular pixel, wherein an application of the difference-of-Gaussians operation with the updated edge-sensitivity value for the particular pixel allows the difference-of-Gaussians operation to detect the edge; and modifying an edge-sensitivity map having edge-sensitivity values for pixels in the input graphic data to include the edge-sensitivity value for the particular pixel, wherein the vectorization algorithm further comprises applying, to graphics data generated from the edge-detection operation, the difference-of-Gaussians operation using the edge-sensitivity values for respective pixels in the graphics data.

19. The non-transitory computer-readable medium of claim 18, wherein the customization specific to the input raster graphic comprises the edge-detection operation and wherein computing the updated edge-sensitivity value comprises:

calculating a first term from a square of the user-specified edge-sensitivity value divided by a maximum edge-sensitivity value available to the graphic manipulation application;

calculating a second term from a difference of the user-specified edge-sensitivity value and the maximum edge-sensitivity value; and setting the updated edge-sensitivity value to a sum of at least the first term and the second term.

20. The non-transitory computer-readable medium of claim 18, wherein the customization specific to the input raster graphic comprises the edge-augmentation operation and wherein computing the updated edge-sensitivity value comprises:

computing an interim value from a sum of (i) a percentage of the user-specified edge-sensitivity value and (ii) the user-specified edge-sensitivity value;

determining if the interim value exceeds a maximum edge-sensitivity value available to the graphic manipulation application; and performing one of:
- setting the updated edge-sensitivity value to the interim value if the interim value is less than or equal to the maximum edge-sensitivity value,
- setting the updated edge-sensitivity value to the maximum edge-sensitivity value if the interim value is greater than the maximum edge-sensitivity value.

\* \* \* \* \*